United States Patent [19]

Tamai et al.

[11] Patent Number: 5,702,228

[45] Date of Patent: Dec. 30, 1997

[54] ROBOTIC ARM SUPPORTING AN OBJECT BY INTERACTIVE MECHANISM

[75] Inventors: Tadamoto Tamai, Fujisawa; Toshitaka Yamamoto, Hoya, both of Japan

[73] Assignee: Sumitomo Heavy Industries, Ltd., Tokyo, Japan

[21] Appl. No.: 682,100

[22] Filed: Jul. 17, 1996

[30] Foreign Application Priority Data

Jul. 31, 1995 [JP] Japan .................. HEI 7-195228

[51] Int. Cl.⁶ .................................................. B25J 15/00
[52] U.S. Cl. ................... 414/744.5; 294/86.4; 294/104; 901/36; 901/39
[58] Field of Search ................... 414/744.5; 901/31, 901/36, 39; 294/104, 86.4, 116

[56] References Cited

U.S. PATENT DOCUMENTS 5,022,695   6/1991   Ayers ..................... 901/39 X
5,168,886  12/1992   Thompson et al. .
5,332,352   7/1994   Poduje et al. .

FOREIGN PATENT DOCUMENTS

WO 94/19821 A1   9/1994   WIPO.

*Primary Examiner*—Donald W. Underwood
*Attorney, Agent, or Firm*—Frishauf, Holtz, Goodman, Langer & Chick

[57] ABSTRACT

An arm member having a folding expansion/contraction mechanism is fixed to a rotary shaft. A support member is rotatively mounted on the distal end of the arm member. This support member maintains a constant relationship with the rotary shaft. An auxiliary support member is mounted on a support shaft fixed to the support member, the auxiliary support member being able to swing. A cam mechanism is provided at rotation portions of the support member and auxiliary support member. The auxiliary support member is swung by this cam mechanism in accordance with a folding expansion/contraction motion of the arm member.

8 Claims, 12 Drawing Sheets

FIG.8A
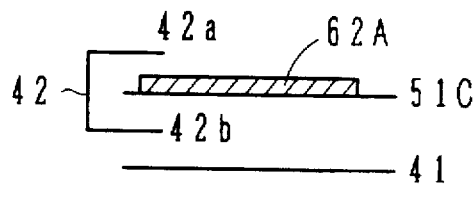
FIG.8B
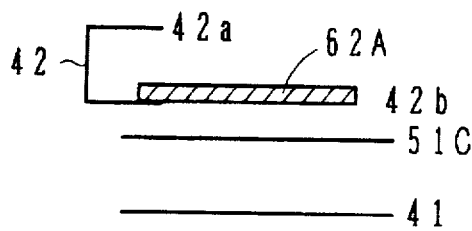
FIG.8C
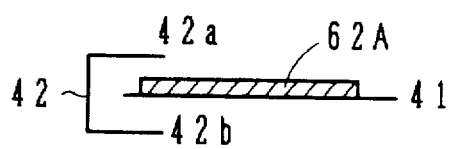
FIG.8D
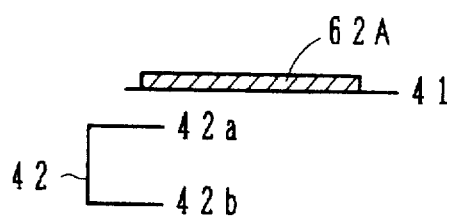
FIG.8E
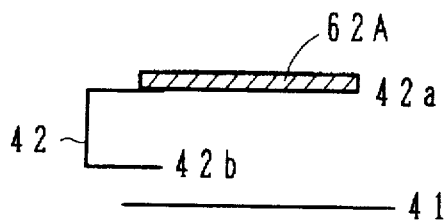
FIG.8F
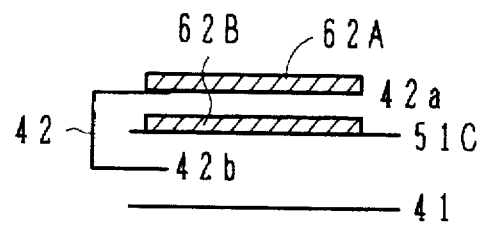
FIG.8G
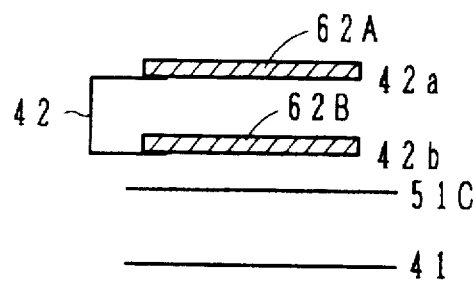
FIG.8H
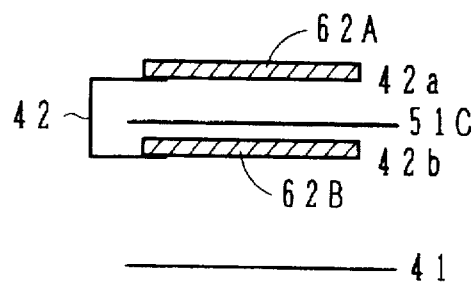
FIG.8I
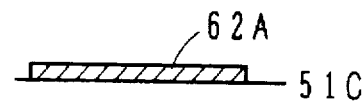
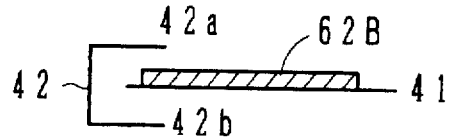

ROBOTIC ARM SUPPORTING AN OBJECT BY INTERACTIVE MECHANISM

BACKGROUND OF THE INVENTION

1. Field of the Invention

The present invention relates to a robotic arm, and more particularly to a robotic arm for holding or releasing a workpiece in response to expanding or contracting itself.

2. Description of the Related Art

Fine particles or contaminations attached to the surface of a semiconductor wafer, a liquid crystal display (LCD), a solar buttery, or the like during an LSI (Large Scale Integration) manufacturing process considerably lower a manufacturing yield of final products. It is therefore desired to transport or keep a semiconductor wafer in a clean environment during the manufacturing processes. Generally, a plurality of semiconductor wafers loaded in a cassette are transferred between processing systems. In a processing system, a semiconductor wafer is moved to a predetermined position by a robotic arm. For fixing a semiconductor wafer during transportation in a processing system, a vacuum chuck or an electrostatic chuck is used. If such a chuck is used, the structure of a robotic arm becomes complicated in order to reliably support a semiconductor wafer during transportation by the robotic arm.

For example, it is very important to wash and clean the surface of a wafer and also not to destruct environments by cleaning. A method is known in which surface cleaning is performed in a low pressure atmosphere using argon gas. With this method, argon gas or mixed gas containing argon gas is cooled to a very low temperature and blown on the surface of a workpiece. As the gas is jetted out of nozzles into a low pressure atmosphere, the gas adiabatically expands quickly and lowers its temperature. Lowered temperature generates solid argon, and fine solid argon particles collide with the surface of a workpiece.

A method of changing argon gas into argon solid has been proposed in which argon containing gas at some pressure is cooled to a temperature slightly higher than a liquefying point of the gas at this pressure and jetted out of nozzles into a low pressure atmosphere.

A processing system used in a low pressure atmosphere is generally installed with a process chamber always maintained in a low pressure atmosphere and a load-lock chamber alternately changed between a low pressure atmosphere and an atmospheric pressure atmosphere. A robot is required for transferring a workpiece between the process chamber and load-lock chamber.

For semiconductor manufacture processes, a robot having a simple mechanism, particularly less generation of particles, is desired.

SUMMARY OF THE INVENTION

It is an object of the present invention to provide a robotic arm not requiring a complicated drive mechanism for supporting a workpiece.

According to one aspect of the present invention, there is provided a robotic arm comprising: a rotary shaft; an arm member fixed to the rotary shaft and having a folding expansion/contraction mechanism; a support member rotatively supported by a distal end of the arm member and having a constant relationship with the rotary shaft; and an auxiliary support member supported by a support shaft fixed to the support member for supporting a workpiece in cooperation with the support member, the auxiliary support member swinging in association with a folding expansion/contraction motion of the arm member.

As the arm member expands or contracts, the auxiliary support member swings in association with the expansion or contraction of the arm member. As the auxiliary support member swings, a workpiece is held or released. Accordingly, the workpiece can be held or released in accordance with the expansion or contraction of the arm member.

According to the present invention, a workpiece can be held with a simple mechanism without using a complicated drive mechanism for holding the workpiece.

BRIEF DESCRIPTION OF THE DRAWINGS

FIGS. 8A to 8I are diagrams conceptually illustrating a method of exchanging the positions of wafers in the buffer chamber.

DETAILED DESCRIPTION OF THE PREFERRED EMBODIMENTS

First, the outline of a surface cleaning system and method using a robotic arm according to an embodiment of the invention will be described with reference to FIGS. 1 and 2.

Figure 1:
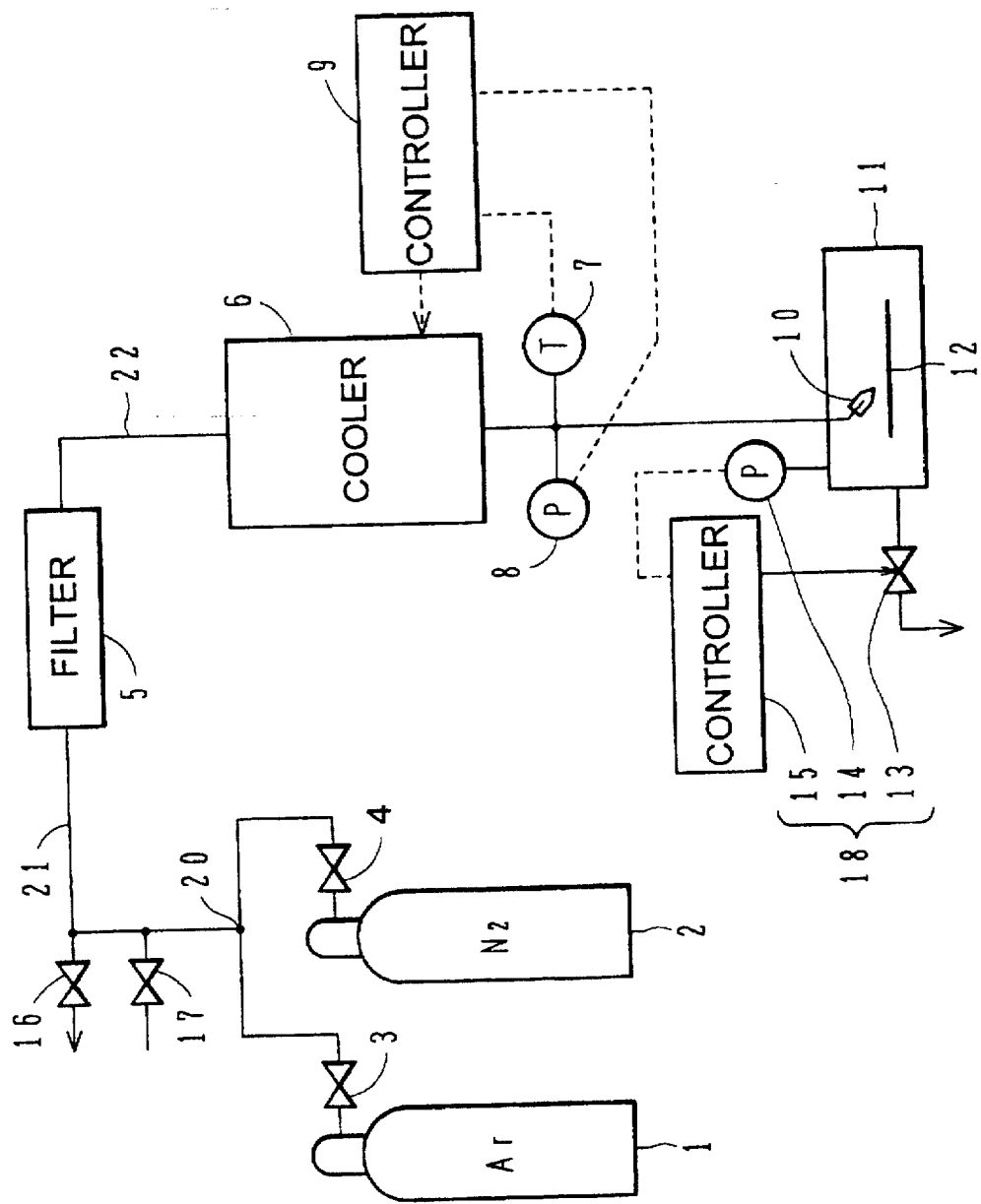
FIG. 1 is a block diagram showing a cleaning system according to an embodiment of the invention.

FIG. 1 is a block diagram of a surface cleaning system according to an embodiment of the invention. An argon (Ar) gas bomb 1 and a nitrogen ($N_2$) gas bomb 2 are connected by pipes via pressure control valves 3 and 4, respectively, to a confluence 20 whereat argon gas and nitrogen gas are mixed. Mixed gas of argon and nitrogen is supplied via a pipe 21 to a filter 5 which removes foreign particles in the mixed gas.

The mixed gas with particles removed is supplied via a pipe 22 to a cooler (or heat exchanger) 6 whereat the gas is cooled and jetted out of a nozzle unit 10 into a vacuum chamber 11. The pressure and temperature of the mixed gas jetted out of the cooler 6 are measured with a pressure gauge 8 and a temperature gauge 7, and the measurement results in the form of electrical signal are supplied to a temperature controller 9.

The temperature controller 9 controls the cooler 6 so that the temperature cooled by the cooler 6 becomes equal to or lower than a liquefying point of argon gas at the measured pressure.

Figure 2:
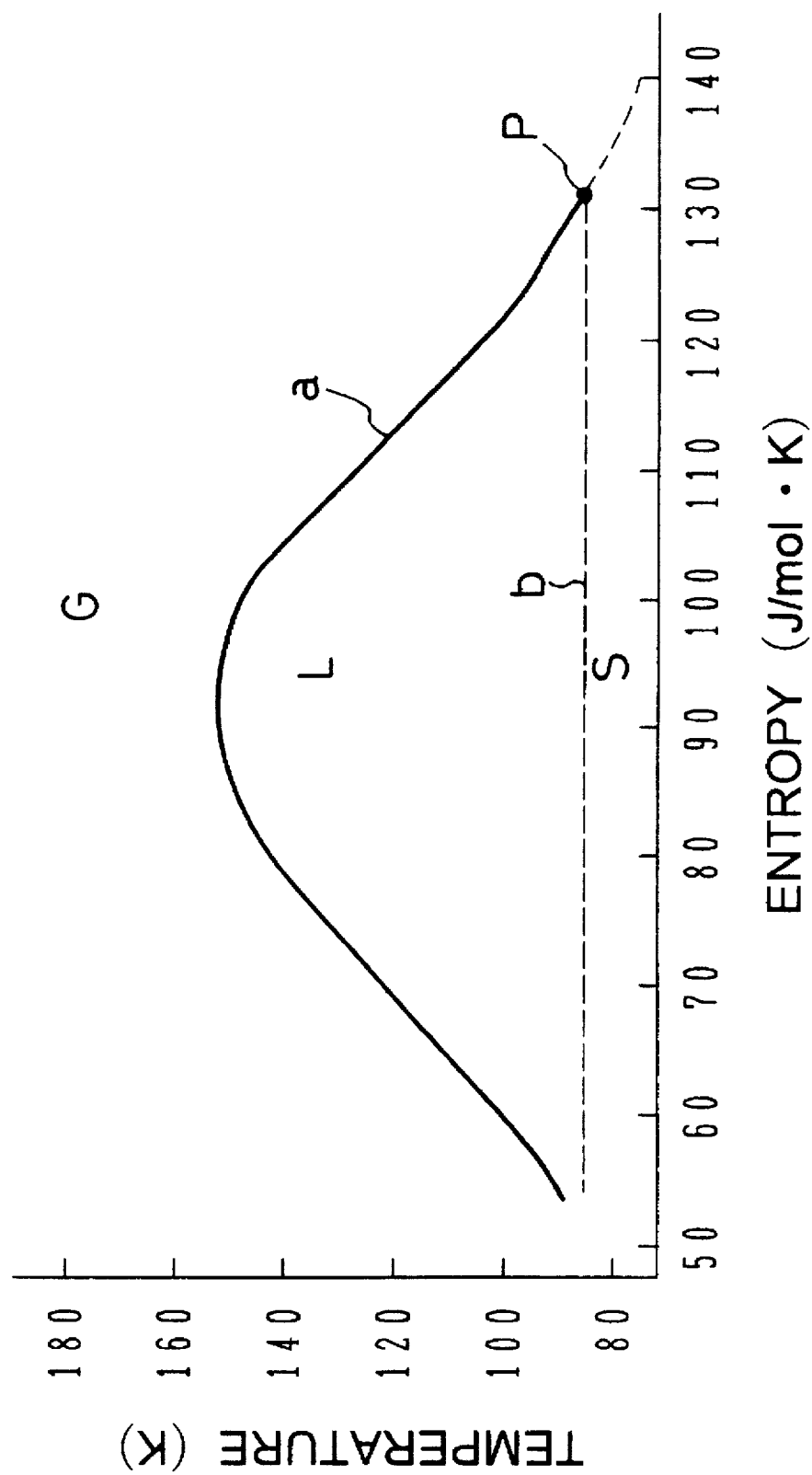
FIG. 2 is a phase diagram of argon.

FIG. 2 is a graph showing a liquefying temperature and a solidifying temperature of argon gas. In FIG. 2, the abscissa represents an entropy in the unit of Joule/(mol.K) and the ordinate represents a temperature in the unit of absolute temperature K. A region G indicates a gas phase, a region L indicates a liquid/gas phase, and a region S indicates a solid/gas phase. A curve a indicates a liquefying temperature (interface between gas and liquid), a broken line indicates a solidifying temperature (interface between liquid and solid), and a point P indicates a triple point of argon.

The temperature controller 9 shown in FIG. 1 controls the cooler 6 in accordance with the input pressure and temperature signals so that the temperature of the gas at the output port of the cooler 6 becomes equal to or lower than a liquefying temperature of argon gas at the measured pressure, satisfying the relationship shown in FIG. 2.

Part or the whole of the argon gas in the mixed gas is cooled and liquefied to form fine droplets.

It is preferable to set the portion of nitrogen gas in the mixed gas to 2 to 70 mol %. Since nitrogen gas has a specific heat larger than argon gas, a necessary heat quantity for cooling gas becomes large if the portion of nitrogen gas is made large. This is why the portion of nitrogen gas is set smaller. In addition, since the liquefying temperature of nitrogen is lower than argon, if nitrogen gas, even if it is small in quantity, is contained in the mixed gas, some carrier gas is left even if the mixed gas is cooled too much.

As the mixed gas is jetted out of the nozzle unit 10 into the vacuum chamber 11, its pressure lowers quickly and the mixed gas expands adiabatically. Therefore, the temperature of the mixed gas lowers quickly and fine droplets change to argon fine particles at least whose surfaces are solidified.

In the above manner, fluid containing a number of argon fine particles is jetted out to the surface of a workpiece 12 and the surface of the workpiece can be efficiently cleaned.

The vacuum chamber 11 is connected via a flow rate control valve 13 to an unrepresented vacuum exhauster. A pressure gage 14 is connected to the vacuum chamber 11, and a signal corresponding to a pressure detected with the pressure gage 14 is supplied to a pressure controller 15.

The pressure controller 15 controls the flow rate control valve 13 in accordance with the detected pressure. A vacuum exhauster means including the flow rate control valve pressure gage 14, and pressure controller 15 maintains the inside of the vacuum chamber 11 at a reduced pressure.

It is preferable for the pressure control valve 13 to control the pressure in the vacuum chamber 11 in a range from 0.2 atmospheric pressure or higher to 0.7 atmospheric pressure or lower in terms of absolute pressure. More preferably, the pressure is controlled to be set to a triple point (0.68 atmospheric pressure) of argon or lower. A proper pressure in the nozzle unit 10 is determined from the pressure in the vacuum chamber 11, and is preferably set to 3 to 7 atmospheric pressure in terms of absolute pressure.

If a pressure difference between the nozzle unit 10 and vacuum chamber 11 is small, high cleaning performance cannot be obtained. As the pressure difference is increased, the cleaning performance is gradually improved. If the pressure difference is made too large, argon fine particles jetted out of the nozzle unit 10 diffuse in the vacuum chamber 11 and is suspended therein so that the cleaning performance is degraded.

The reason for this may be ascribed as in the following.

If a pressure difference is small, an adiabatic expansion amount of the mixed gas is small. It is therefore considered that argon fine droplets are not solidified and collide with the cleaning surface. The cleaning performance in this state is low. If a pressure difference is too large, the adiabatic expansion amount of the mixed gas becomes large and the temperature of the mixed gas lowers greatly. It is therefore considered that argon fine droplets are solidified almost to the center thereof and the solid particles collided with the cleaning surface are elastically repelled. The cleaning performance in this state is also low.

If a pressure difference is proper, it can be presumed that only the surfaces of argon fine droplets are solidified and the insides thereof are in a liquid phase. If the argon fine particles have shells formed only on the surfaces thereof, these shells are broken upon collision with the cleaning surface and will not be elastically repelled. It can be therefore considered that the cleaning performance is improved.

If the pressure in the vacuum chamber 11 is equal to or lower than the triple point of argon, argon in the liquid phase does not exist so that at least the surfaces of argon fine droplets are solidified. By setting the pressure in the vacuum chamber 11 to the triple point of argon or lower, it becomes easy to control the argon fine droplets to change to argon fine particles with shells.

It is preferable to evacuate the atmosphere in the cleaning system via a valve 17 connected to the pipe 21 prior to introducing gas into the system to avoid mixture of impurity gas. It is also preferable to vent the mixed gas by opening a valve 17 after the system running is stopped.

Since the pressure at the upstream of the nozzle unit 10 is maintained generally constant, the pressure gauge 8 may be set to the upstream of the cooler 6.

In the above description, mixed gas of argon gas and nitrogen gas is used, the argon gas is liquefied, and fine droplets are flowed in the nitrogen gas or mixed gas. Instead of the mixed gas, only argon gas may be used.

In this case, part of argon gas is changed to fine droplets when it passes through the cooler 6 and is suspended in the remaining argon gas. Therefore, argon gas of several % to 100% can be used as the cleaning gas. Liquid instead of droplets may stay at the lower portion of the nozzle unit. This liquid changes to droplets when the liquid as well as gas is jetted out of the nozzle unit.

The workpiece 12 in the vacuum chamber 11 may be heated. When the gas containing argon fine droplets is jetted out of the nozzle unit 10, at least the surfaces of fine droplets are solidified and these droplets collide with the workpiece 12. If the temperature of the workpiece is raised to some degree, argon fine particles or droplets attached to the surface of the workpiece vaporize quickly.

In the above manner, both the sand blast effects and vaporization of particles may be used for cleaning. The diameters of argon fine particles can be controlled by adjusting argon gas portion and pressure, a cooling ability, a cooling temperature, and the like.

One cooler is used in the example shown in FIG. 1. Two or more coolers may be used. Impurity gas may be liquefied and removed at a first stage cooler, and argon may be liquefied at a second stage cooler.

Figure 3:
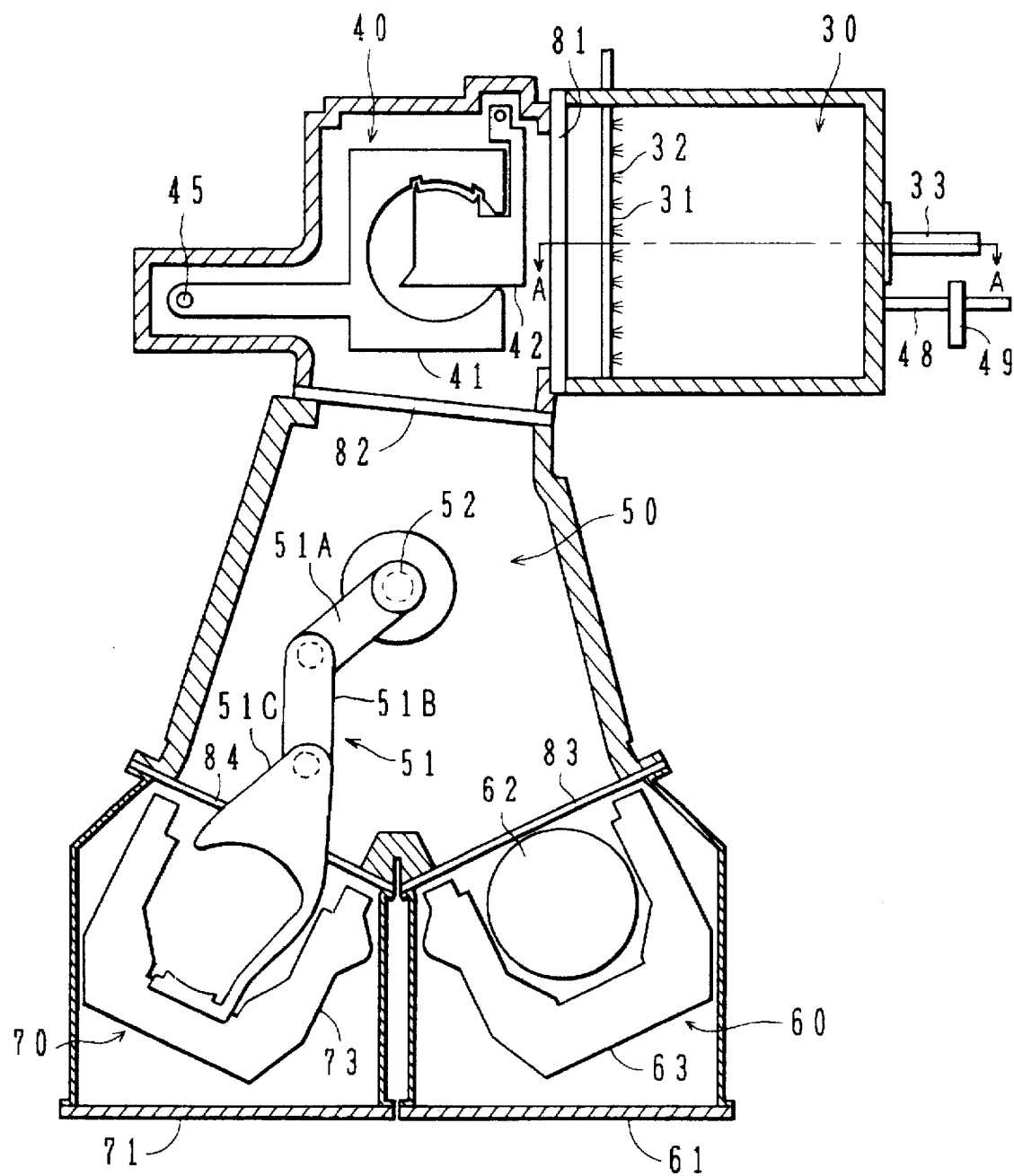
FIG. 3 is a cross sectional plan view of a cleaning system according to an embodiment of the invention.

FIG. 3 is a cross sectional plan view of a wafer cleaning system according to an embodiment of the invention. The wafer cleaning system is constituted by a cleaning chamber 30, a buffer chamber 40, a robot chamber 50, a wafer loading chamber 60, and a wafer unloading chamber 70. The cleaning chamber 30 and buffer chamber 40 are partitioned by a gate valve 81, the buffer chamber 40 and robot chamber 50 are partitioned by a gate valve 82, the robot chamber 50 and wafer loading chamber 60 are partitioned by a gate valve 83, and the robot chamber 50 and wafer unloading chamber 70 are partitioned by a gate valve 84. The inside of each chamber is connected to a vacuum pump (not shown) via a valve and can be evacuated independently.

A nozzle header 31 of a straight tube made of pure aluminum is mounted on the inside of the cleaning chamber 30. The side wall of the nozzle header 31 is formed with a plurality of nozzle holes 32 in the axial direction. The nozzle holes 32 are through holes formed in the side wall of the nozzle header 31. A small tube made of aluminum or sapphire may be inserted into the through hole to form each nozzle hole 32. Gas containing argon fine droplets is supplied to the nozzle header 31 as described with FIG. 1. The gas supplied into the nozzle header 31 is jetted out of the nozzle holes 32 into the cleaning chamber 30. At this time, the gas expands adiabatically and is cooled to form argon fine particles.

A flow rate control mechanism 33 is mounted on the end wall of the cleaning chamber 30 and can control the inside of the cleaning chamber 30 through evacuation so as to have a desired pressure.

Doors 61 and 71 are mounted on the wafer loading and unloading chambers 60 and 70. By opening the doors 61 and 71, wafer carriers holding wafers can be loaded or unloaded. A wafer 62 to be cleaned is held by a wafer carrier 63 and placed in the wafer loading chamber 60. A cleaned wafer is sequentially accommodated in a wafer carrier 73 disposed in the wafer unloading chamber 70.

A robotic arm 51 for transporting a wafer is accommodated in the robot chamber 50. The robotic arm 51 is constituted by a first arm 51A mounted on a rotary shaft 52 with an elevator mechanism, a second arm 51B mounted on the distal end of the first arm 51A, and an arm head 51C mounted on the distal end of the second arm 51B. The robotic arm 51 can move its arm head 51C over the rotary shaft 52 by bending each connection point between arms. By expanding and contracting the connection point of each arm around the rotary shaft 52, the arm head 51C can move into the buffer chamber 40, wafer loading chamber 60, or wafer unloading chamber 70.

The robotic arm 51 can be moved linearly up and down (in the direction normal to the surface of a drawing sheet). By moving the arm head 51C under a wafer in the wafer loading chamber 60 or buffer chamber 40 and raising the arm head 51C, the wafer can be placed on the arm head 51C. Conversely, by placing a wafer on the arm head 51C, moving the arm head 51C over the position where the wafer is held in the wafer unloading chamber 60 or buffer chamber 40, and lowering the arm head 51C, the wafer can be placed on a predetermined position.

A wafer holder 41 and a buffer plate 42 are disposed in the buffer chamber 40. The wafer holder 41 is supported in the buffer chamber 40 by a support shaft 45. The support shaft 45 is coupled to a drive shaft 48 via the lower portion of the buffer chamber 40. The drive shaft 48 receives a drive force from a ball screw mechanism 49 and is moved linearly in the lateral direction as viewed in FIG. 3. As the drive shaft 48 is moved linearly in the lateral direction, the support shaft 45 and wafer holder 41 can be moved in the lateral direction. The drive shaft 48 is coupled air tightly to the buffer chamber by a bellows. FIG. 3 shows the wafer holder 41 at a home position of the buffer chamber 40.

The wafer holder 41 holds a wafer and moves right as viewed in FIG. 3 into the cleaning chamber 30 to the position where the wafer positions at the right of the nozzle header 31. After the wafer is transported into the cleaning chamber 30, the wafer holder 41 gradually moves left while reciprocally moving up and down as viewed in FIG. 3. At this time, gas containing argon fine particles jetted out of a plurality of nozzle holes 32 of the nozzle header 31 is blown to the surface of the wafer to clean it. The amplitude of reciprocal motion of the wafer holder 41 during cleaning is set larger than the pitch of the nozzle holes 32 and the motion speed to the left is set properly, so that the whole surface of the wafer can be cleaned. The wafer holding mechanism of the wafer holder 41 will be later detailed with reference to FIG. 9.

The buffer plate 42 is used for temporarily holding a wafer, when the wafer is transferred from the arm head 51C to the wafer holder 41, or from the wafer holder 41 to the arm head 51C. The buffer plate 42 has two stages for holding two wafers at the same time. A wafer transfer method in the buffer chamber 40 will be later detailed with reference to FIGS. 7A to 8I.

Next, the processes of cleaning a wafer with the cleaning system shown in FIG. 3 will be described.

First, all the gate valves 81 to 84 are closed and the buffer chamber 40 and robot chamber 50 are evacuated to a pressure of 100 mtorr or lower. While gas containing argon fine particles is jetted out of the nozzle header 31 into the cleaning chamber 30, the cleaning chamber 30 is evacuated to a pressure of 0.3 to 0.7 atmospheric pressure. A wafer carrier 63 having a plurality of wafers 62 still not cleaned is placed in the wafer loading chamber 60. An empty wafer carrier 73 is placed in the wafer unloading chamber 70. The wafer loading and unloading chambers 60 and 70 are evacuated to a pressure of 100 mtorr or lower.

The gate valve 83 is opened to move the arm head 51C into the wafer loading chamber 60, and the wafer 62 still not cleaned is placed on the arm head 51C. By contracting the robotic arm 51, the wafer is transferred from the wafer loading chamber 60 to the robot chamber 50. The gate valve 83 is closed thereafter.

The gate valve 82 is opened to move the arm head 51C to the buffer chamber 40, and the wafer held by the arm head 51C is transferred via the buffer plate 42 to the wafer holder 41. If a cleaned wafer is held by the buffer plate 42, it is transferred to the arm head 51C, which transports the cleaned wafer from the buffer chamber 40 to the robot chamber 50. The gate valve 82 is closed thereafter.

Nitrogen gas is introduced into the buffer chamber 40 and the pressure in the buffer chamber 40 is set nearly equal to that in the cleaning chamber 30. After the pressures in the buffer chamber 40 and the cleaning chamber 30 are set nearly equal, the gate valve 81 is opened. Since the pressures in the buffer chamber 40 and the cleaning chamber 30 are nearly equal, turbulent gas motion will not occur even if the gate valve 81 is opened. Therefore, it is possible to prevent particles attached to the inner walls of the chamber from being blown up and attached to the wafer.

The wafer holder 41 is moved right as viewed in FIG. 3 to transport the wafer into the cleaning chamber 30. The wafer holder is gradually moved left while it is reciprocally moved up and down as viewed in FIG. 3. At this time, gas containing argon fine particles jetted out of the nozzle holes 32 is blown to the wafer surface to clean it. After cleaning, the wafer holder 41 is accommodated in the buffer chamber 40 and the gate valve 81 is closed. The buffer chamber 40 is evacuated to a pressure of 100 mtorr or lower, and the cleaned wafer is transferred from the wafer holder 41 to the buffer plate 42.

In parallel with wafer cleaning, the robotic arm 51 accommodates a cleaned wafer in the wafer carrier 73 in the wafer unloading chamber 70. The robotic arm 51 picks up a next wafer to be cleaned from the wafer loading chamber 60 and transfers it to the robot chamber 50.

After the gate valve 82 is opened, the wafer to be cleaned and held by the robotic arm 51 is transferred to the wafer holder 41. The cleaned wafer held by the buffer plate 42 is transferred to the arm head 51C and to the robot chamber 50.

The above processes are repeated to sequentially clean a plurality of wafers.

With the above processes, nitrogen gas is introduced into the buffer chamber 40 in order to make the pressures in the buffer chamber 40 and cleaning chamber 30 equal. Instead of introducing nitrogen gas, another method may be used wherein the vacuum degree in the cleaning chamber 30 is raised generally equal to the vacuum degree in the buffer chamber. In order to raise the vacuum degree in the cleaning chamber 30, it is necessary to stop a supply of the gas containing argon fine particles to be jetted out of the nozzle header 31. When the gas supply is stopped, the pressure in the nozzle header 31 abruptly lowers and the gas in the nozzle header 31 expands adiabatically. This adiabatic expansion lowers the temperature quickly and solidifies argon in the nozzle header 31.

Solid argon generated in the nozzle header 31 is hard to decay. Solid argon may choke the nozzle holes 32. The conditions of a temperature, pressure and the like in the nozzle header 31 for the next cleaning become difficult to set. Therefore, raising the vacuum degree in the cleaning chamber 30 to eliminate a pressure difference between the buffer chamber 40 and the cleaning chamber 30 is not preferable.

As shown in FIG. 3, the cleaning chamber 30 is not directly connected to the robot chamber 50 but they are indirectly coupled via the buffer chamber 40. It is therefore possible to transfer a wafer between the cleaning chamber 30 and the robot chamber 50, without evacuating the cleaning chamber 30 to a high vacuum degree.

In the processes described with FIG. 3, surface cleaning is performed by jetting out fluid containing argon fine particles into the cleaning chamber 30. The effects of the buffer chamber 40 are not limited only to surface cleaning, but the buffer chamber 40 is effective for processing of the cleaning chamber 30 in a reduced pressure atmosphere. The buffer chamber 40 is particularly effective in case that the pressure in the robot chamber 50 is different from that in the cleaning chamber 30. The robot chamber 50 is evacuated with a usual vacuum pump to about 100 mtorr or lower. Therefore, the robot chamber 50 is very effective for processing in a reduced pressure atmosphere in a range from about 100 mtorr or higher to an atmospheric pressure or lower.

Next, with reference to FIG. 4, the structure of the cleaning chamber will be described.

Figure 4:
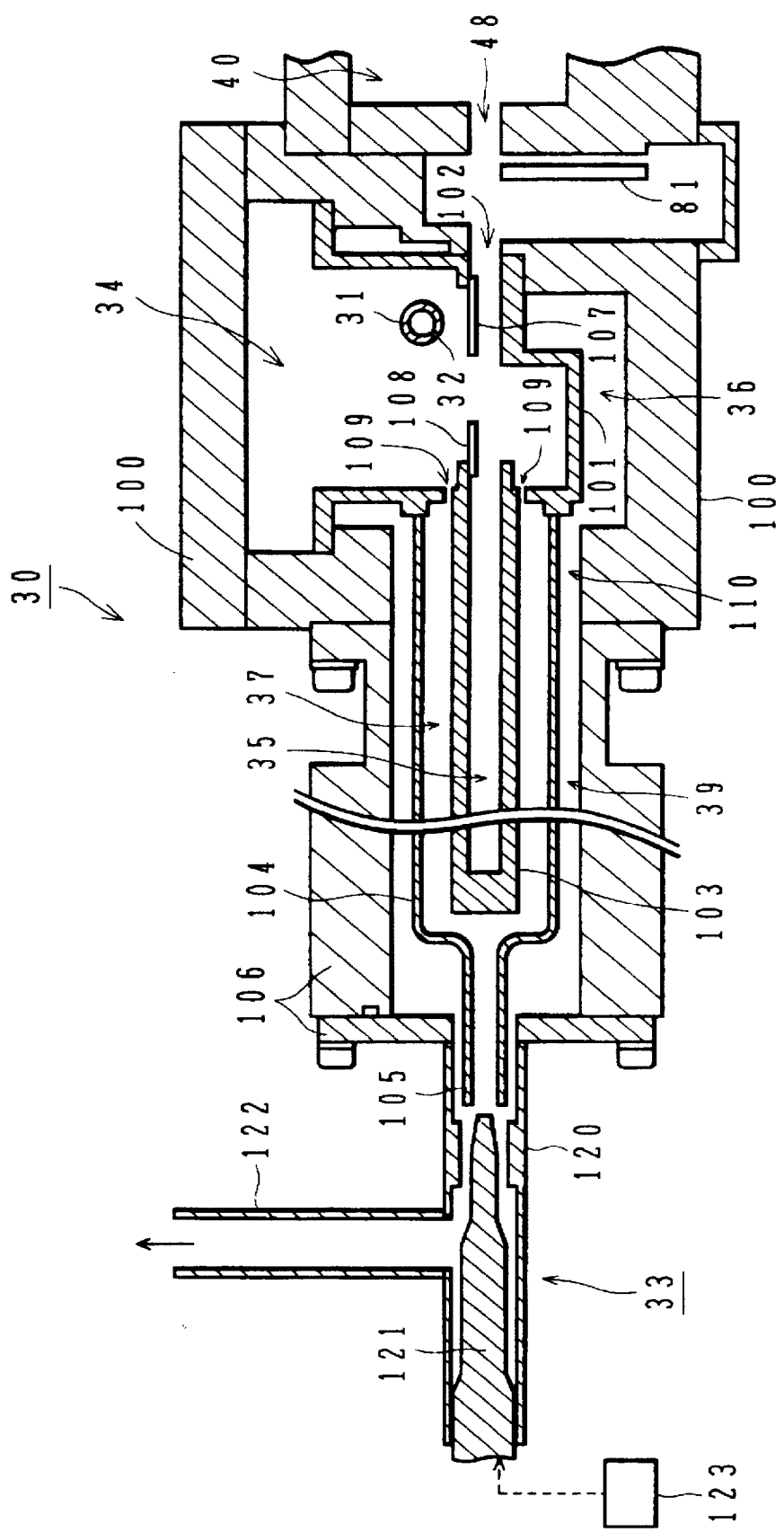
FIG. 4 is a cross sectional view of a cleaning chamber of the cleaning system shown in FIG. 3.

FIG. 4 is a cross sectional view taken along one-dot chain line A—A of FIG. 3. The cleaning chamber 30 is constituted mainly by a main chamber 34, a subsidiary chamber 35, and a heat shielding chamber 36. An outer wall 100 defines the main chamber 34 and heat shielding chamber 36. The main chamber 34 and heat shielding chamber 36 are separated by a heat shielding plate 101. Although the heat shielding plate 101 may be disposed surrounding the whole circumference of the main chamber 34, it is disposed only at the side portion and lower portion of the main chamber 34 as shown in FIG. 4. Therefore, the upper portion of the main chamber 34 is separated from an atmospheric pressure atmosphere only by the outer wall 100.

In the outer wall 100 and the side wall of the heat shielding plate 101 on the buffer chamber 40 side, a slit-like through hole 102 is formed. A similar through hole 48 is also formed in the side wall of the heat shielding plate on the buffer chamber 40 side. The buffer chamber 40 and main chamber 34 communicate with each other via the through holes 102 and 48. A gate valve 81 is disposed between the outer wall 100 and the side wall of the buffer chamber 40. As the gate valve 81 blocks the through hole 48, the main chamber 34 and the buffer chamber 40 can be separated.

The subsidiary chamber 35 is disposed at the position facing the buffer chamber 40 with the main chamber 34 being interposed therebetween. The subsidiary chamber 35 is a cavity defined by a box-like subsidiary chamber wall 103 having opening only at the main chamber 34 side. For cleaning, a wafer is loaded from the buffer chamber 40 via the through holes 48 and 102 and the main chamber 34 into the subsidiary chamber 35.

The nozzle header 31 is mounted in the main chamber 34 at the position slightly higher than the through hole 102. Gas containing argon fine particles is jetted out of the nozzle holes 32 of the nozzle header 31 obliquely downward from the through hole 102 side to the subsidiary chamber 35 side. Between the nozzle header 31 and a wafer passage, shielding plates 107 and 108 are mounted in order to shield the outer circumferential portion of a gas flow jetted out of the nozzle holes 32. Only a gas flow at the central portion not shielded by the shielding plates 107 and 108 collides with the wafer surface. When a wafer is not transported into the cleaning chamber 30, the gas flow jetted out of the nozzle holes 32 collides with the heat shielding plate 101. The structure and effects of the shielding plates 107 and 108 will be later detailed with reference to FIGS. 12A and 12B.

An outer wall 106 air tightly mounted on the outer wall 100 surrounds the circumference of the subsidiary chamber wall 103. In the cavity between the outer wall 106 and subsidiary chamber wall 103, a gas flow path separation plate 104 is disposed. Between the gas flow separation plate 104 and subsidiary chamber wall 103, a gas flow path 37 is defined, and between the gas flow path separation plate 104 and outer wall 106, a gas flow path 39 is defined.

The end of the gas flow path separation plate 104 on the main chamber 34 side is in tight contact with the heat shielding plate 101. The gas flow path 37 communicates with the main chamber 34 via a gap 109 formed between the heat shielding plate 101 and subsidiary chamber wall 103. The gas flow path 39 communicates with the heat shielding chamber 36 via a gap 110 formed between the outer wall 100 and subsidiary chamber wall 103.

The end of the gas flow path separation plate 104 on the opposite side of the main chamber 34 is mounted with a cylindrical gas flow path separation tube 105. The head of the gas flow path separation tube 105 is inserted into the flow rate control mechanism 33. The main chamber 34 is connected to the flow rate control mechanism 33 via the gas flow path 37 and the inner cavities of the gas flow separation tube 105. The heat shielding chamber 36 is connected to the flow rate control mechanism 33 via the gas flow path 39 and the outer cavities of the gas flow path separation tube 105.

The gas flow control mechanism 33 is constituted by an outer pipe 120, a needle 121, an exhaust pipe 122, and a needle drive mechanism 123. One end of the outer pipe 120 is air tightly mounted on the outer wall 106 so that the head of the gas flow path separation tube 105 can be inserted into the outer pipe 120. The gas flow paths 37 and 39 communicate with the inner cavity of the outer pipe 120 via the inner and outer cavities of the gas flow path separation tube 105.

The needle 121 inserted into the inner cavity of the outer pipe 120 has a small diameter rod portion, a middle diameter rod portion, and a large diameter rod portion. The diameter changing portions of the needle 121 and the tip of the small diameter rod portion are formed with tapers. The needle drive mechanism 123 moves the needle 121 in the axial direction and controls the insertion depth into the outer pipe 120. One end of the exhaust pipe 122 is connected to the side wall of the outer pipe 120, and the inside of the outer pipe 120 is exhausted via the exhaust pipe 122. By changing the insertion depth of the needle 121, the conductance of a gas flow path can be changed and the exhaust flow rate can be controlled. The flow rate control mechanism 33 will be later detailed with reference to FIGS. 5A to 6.

Next, a wafer cleaning method will be described paying attention to the cleaning chamber 30.

Gas containing argon fine particles is jetted out of the nozzle header 31 to cool the inside of the main chamber 34 and make the temperature in the main chamber 34 enter a steady state. Gas and argon fine particles jetted out of the nozzle header 31 are exhausted to the outside via the gas 109 and gas flow path 37.

Since argon fine particles collide with the heat shielding plate 101. This plate is cooled to about a liquefying point of argon. Since the heat shielding plate 101 is cooled to a low temperature, it is difficult to make the coupling surfaces between the heat shielding plate 101 and outer wall 100 air tight by using an O ring or the like. In the structure shown in FIG. 4, the heat shielding plate 101 and outer wall 100 are made in direct contact with each other, without using an O ring or the like. Therefore, part of gas leaks from the main chamber 34 to the heat shielding chamber 36 via these coupling surfaces. The gas leaked into the heat shielding chamber 36 is exhausted to the outside via the gap 110 and gas flow path 39.

The flow rate control mechanism 33 controls the pressures in the main chamber 34 and heat shielding chamber 36 to have 0.3 to 0.7 atmospheric pressure and 0.2 to 0.6 atmospheric pressure, respectively. The reason why the pressure in the heat shielding chamber 36 is set lower than that in the main chamber 34, Is to prevent gas in the heat shielding chamber 36 from flowing back to the main chamber 34.

A wafer is held by the wafer holder 41 described with FIG. 3 and transported from the buffer chamber 40 to the subsidiary chamber 35 via the through holes 48 and 102. The wafer transported into the subsidiary chamber 35 is moved under the shielding plates 107 and 108 of the main chamber 34 and returned into the buffer chamber 40. As the wafer moves under the shielding plates 107 and 108, a gas flow containing argon fine particles collides with the wafer surface to clean it.

In order to shorten the time required for the inside of the main chamber 34 to be cooled to a steady state, it is preferable to make the heat capacity of the heat shielding plate 101 as small as possible. In this embodiment, an aluminum plate of 5 mm thick Is used as the heat shielding plate 101.

In order to enhance the heat shielding effects of the heat shielding chamber, it is preferable to make the inside of the heat shielding chamber 36 to have as high a vacuum degree as possible. In order to make large a pressure difference between the main chamber 34 and heat shielding chamber 36, the heat shielding plate 101 is required to have a large mechanical strength. It is not preferable to increase the mechanical strength by thickening the heat shielding plate 101, because the heat capacity becomes large. In this embodiment, therefore, a pressure difference between the main chamber 34 and heat shielding chamber 36 is set to about 0.1 atmospheric pressure.

As the temperature of the outer surface of the outer wall 100 lowers, water condensed at the surface. As the temperature further lowers, frost attaches to the surface. In order to avoid the condensation of water, it is preferable to thicken the outer wall 100 and have a large temperature difference between the outer and inner surfaces of the outer wall 100. In this embodiment, the thickness of the outer wall 100 is set to 20 mm.

In the description with FIG. 4, fluid containing argon fine particles is jetted out into the main chamber 34. The effects of the heat shielding plate 101 is not limited to jetting out argon fine particles. The effects of the heat shielding plate 101 can be expected also for the case wherein other low temperature fluids are jetted out.

Next, the structure and operation of the flow rate control mechanism 33 will be described with reference to FIGS. 5A and 5B.

Figure 5A:
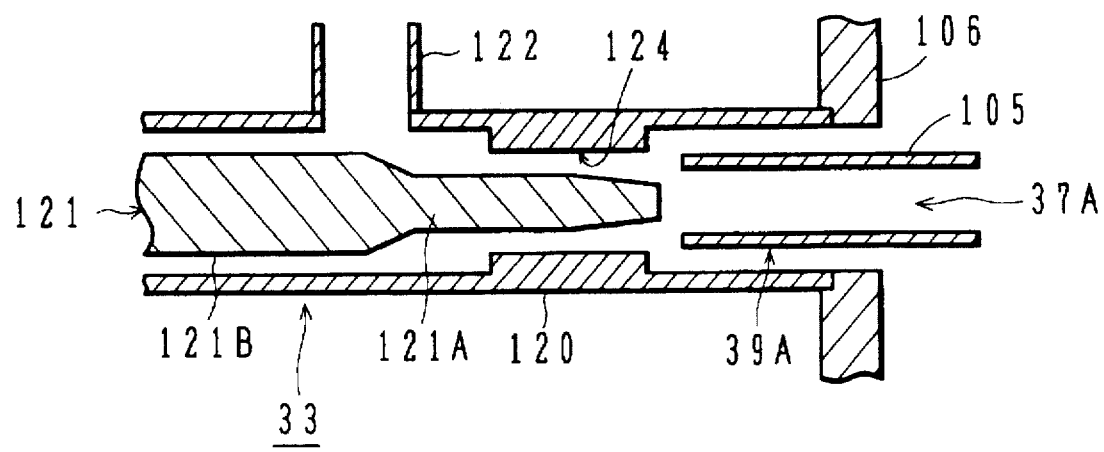
FIGS. 5A and 5B are cross sectional views of a flow rate control mechanism of the cleaning system shown in FIG. 3.
Figure 5B:
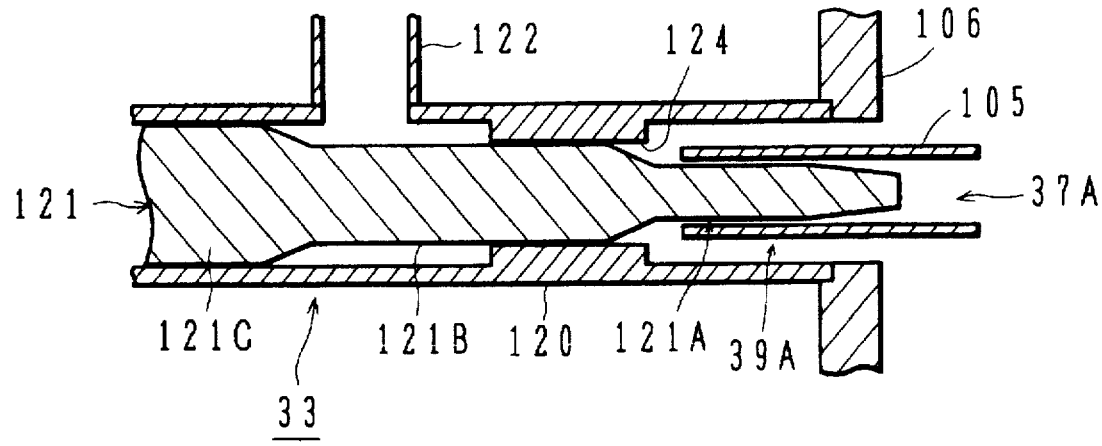

FIGS. 5A and 5B are cross sectional views of the flow rate control mechanism 33. The flow rate control mechanism 33 is constituted by the cylindrical outer pipe 120, needle 121, and exhaust pipe 122.

One end of the outer pipe 120 is air tightly mounted on the outer wall 106 of the cleaning chamber, and the inner cavity of the outer pipe 120 communicates with the inside of the cleaning chamber. The gas flow separation tube 105 is inserted into the inner cavity of the outer pipe 120 from one end thereof. A gas flow path 37A in the gas flow path separation tube 105 communicates with the main chamber 34 via the gas flow path 37, as described with FIG. 4. A cylindrical gas flow path 39A formed between the outer circumference of the gas flow path separation tube 105 and the inner circumference of the outer pipe 120, communicates with the heat shielding chamber 36 via the gas flow path 39.

One end of the exhaust pipe 122 is mounted on the side wall of the outer pipe 120, and the other end is connected to a vacuum pump (not shown). The inner cavity of the outer pipe 120 can be evacuated through the exhaust pipe 122.

A small diameter portion 124 is formed on the inner wall of the outer pipe 120, at the area between the head of the gas flow path separation tube 105 and the coupling position between the exhaust pipe 122 and the outer pipe 120.

The needle 121 is constituted by a small diameter rod portion 121A, a middle diameter rod portion 121B, a large diameter rod portion 121C, and taper portions interconnecting these. The outer diameter of the small diameter rod portion 121A is slightly smaller than the inner diameter of the gas flow path separation tube 105, the outer diameter of the middle diameter rod portion 121B is slightly smaller than the inner diameter of the small diameter portion 124, and the outer diameter of the large diameter rod portion 121C is slightly smaller than the inner diameter of the outer pipe 121.

As shown in FIGS. 5A and 5B, the needle 121 is inserted into the outer pipe 120 starting from the end of the small diameter rod portion 121A. The needle drive mechanism 123 shown in FIG. 4 controls an insertion depth of the needle 121. FIG. 5A shows the needle 121 shallowly inserted into the outer pipe 120, and FIG. 5B shows the needle 121 deeply inserted into the outer pipe 120. As shown in FIG. 5B, as the needle 121 is deeply inserted into the outer pipe 120, the small diameter rod portion 121A is inserted into the gas flow path 37A of the gas flow path separation tube 105, and part of the middle diameter rod portion 121B on the head side is inserted into the small diameter portion 124.

As shown in FIG. 5A, when the insertion depth of the needle 121 is shallow and the small diameter rod portion 121A is not inserted into the gas flow path separation tube 105, both the gas flow paths 37A and 39A communicate with the exhaust pipe 122 via the gap formed between the needle 121 and the inner surface of the outer pipe 120. As above, relatively broad gas flow paths are formed between the gas flow path 37A and the exhaust pipe 122 and between the gas flow path 39A and the exhaust pipe 122, and the gas flow paths 37A and 39A are exhausted via these relatively broad gas flow paths.

As shown in FIG. 5B, if most of the small diameter rod portion 121A is inserted into the gas flow path 37A, gas flow paths communicating the gas flow paths 37A and 39A with the exhaust pipe 122 are made narrow. Specifically, the gas flow path 37A communicates with the exhaust pipe 122 via a narrow gap between the outer surface of the small diameter rod portion 121A and the inner surface of the gas flow path separation tube 105 and via a narrow gap between the outer surface of the middle rod portion 121B and the inner surface of he small diameter portion 124. The gas flow path 39A communicates with the exhaust pipe 122 via a narrow gap between the outer surface of the middle diameter rod portion 121B and the inner surface of the small diameter portion 124. These narrow gaps function as a flow resistance.

This flow resistance lowers the conductance of the gas flow paths communicating the gas flow paths 37A and 39A with the exhaust pipe 122, so that an exhaust ability in the gas flow paths 37A and 39A lowers. A flow resistance by the small diameter rod portion 121A and middle diameter rod portion 121B is serially connected to the gas flow path communicating the gas flow path 37A with the exhaust pipe 122. In contrast, only a flow resistance by the middle diameter rod portion 121B is connected to the gas flow path communicating the gas flow path 39A with the exhaust pipe 122. Therefore, an exhaust ability in the gas flow path 37A lowers greatly as compared to that in the gas flow path 39A.

A difference in exhaust ability between the gas flow paths 37A and 39A can be set to a desired value by adjusting the difference between the outer diameter of the small diameter rod portion 121A and the inner diameter of the gas flow path separation tube 105, the difference between the outer diameter of the middle diameter rod portion 121B and the inner diameter of the small diameter portion 124, the ratio of the length of the flow resistance area of the small diameter rod portion 121A to that of the middle diameter rod portion 121B, and the like.

Next, the experiment results of pressure control in a vacuum chamber by using the flow rate control mechanism shown in FIGS. 5A and 5B will be described with reference to FIG. 6.

Figure 6:
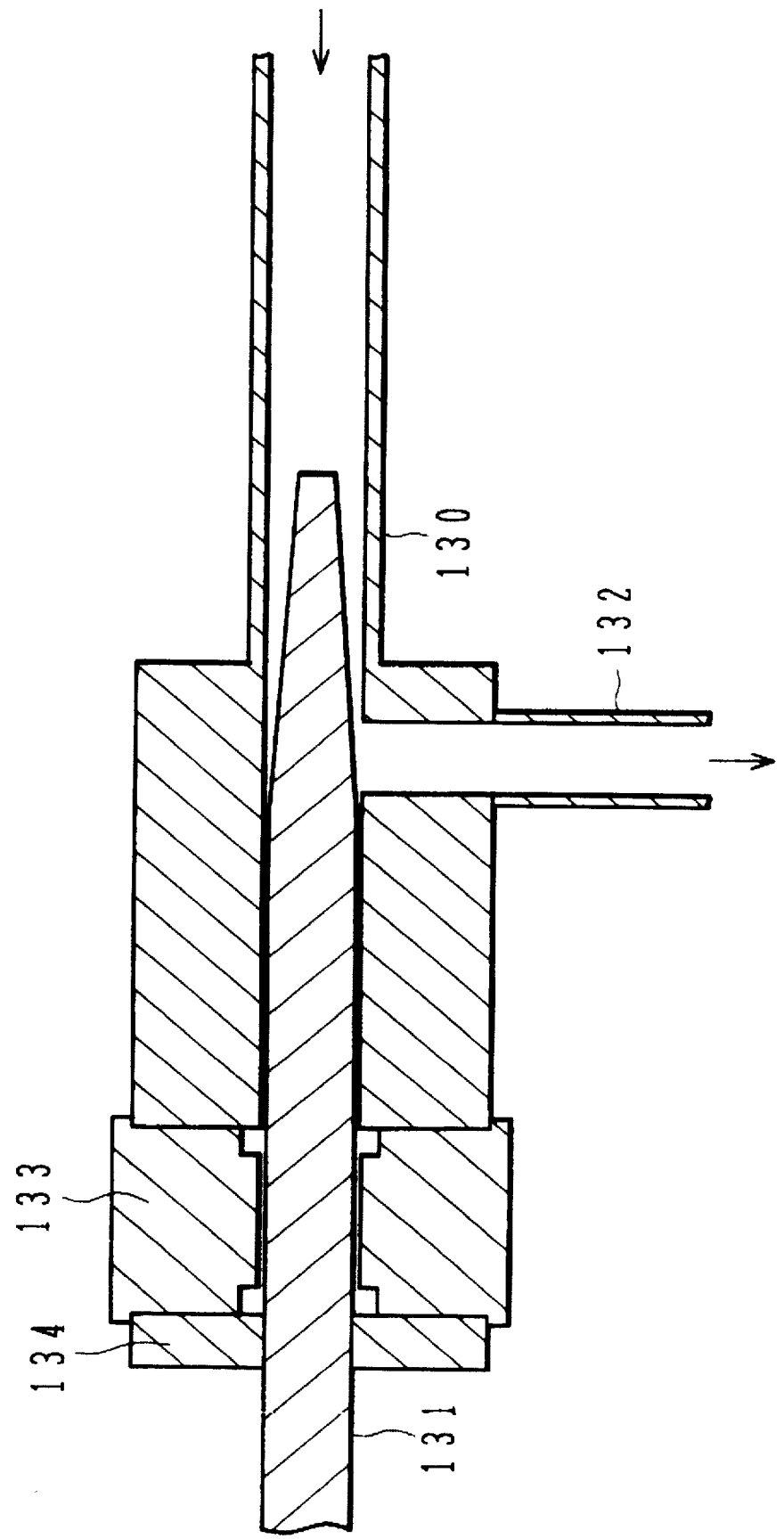
FIG. 6 is a cross sectional view of a flow rate control mechanism used by experiments.

FIG. 6 is a cross sectional view of the flow rate control mechanism used by the experiments. The needle of the flow rate control mechanism used by the experiments has the same diameter except at the tapered head. This needle may be considered as the needle 121 shown in FIGS. 5A and 5B having only the small diameter rod portion 121A or middle diameter rod portion 121B.

The needle 131 is being inserted into the outer pipe 130. A needle support ring 133 having a through hole of generally the same diameter as the needle 131 is mounted on the outer pipe 130 at the left end as viewed in FIG. 6, and this ring is fixed to the outer pipe 130 by a fixing ring 134. The needle 131 is inserted into the thorough hole of the needle support ring 133 and supported in the radial direction. The inner diameter of the outer pipe 130 is 10.2 mm, and the outer diameter of the needle 131 is 9.53 mm. One end of the exhaust pipe 132 is connected to the side wall of the outer pipe 130, and the other end is connected to a vacuum pump (not shown). An exhaust ability of the vacuum pump is about 500 litters/min.

The right end of the outer pipe 130 as viewed in FIG. 6 is connected to a vacuum chamber (not shown). Under these conditions, the pressure in the vacuum chamber was controlled. Nitrogen gas with a flow rate of 4 slm and argon gas with a flow rate of 40 slm were introduced into the vacuum chamber. Under these conditions, the pressure in the vacuum chamber was changed in a range from 0.2 to 0.5 atmospheric pressure, and was able to control stably. In the range from 0.2 to 0.5 atmospheric pressure, the atmospheric pressure was changed by about 0.01 by moving the needle 131 by 0.5 mm in the axial direction.

With a conventional needle valve, the tapered head of the needle is inserted into a circular opening to change the opening area, i.e., a cross sectional area of a gas flow path, to control the flow rate. In order to obtain a relatively high vacuum, even a conventional method can control the pressure stably. However, it was difficult for the conventional valve to stably change the pressure by 0.01 atmospheric pressure in the range from 0.2 to 0.7 atmospheric pressure. As shown in FIG. 6, not by changing the cross sectional area of a gas flow path but by using the flow rate control mechanism which changes the length of a flow resistance area to adjust the conductance, the pressure of about 0.2 to 0.7 atmospheric pressure was able to control stably.

If the head of a conventional needle valve is inserted into the opening deeply, there is a possibility that the tapered surface contacts the inner edge of the opening. If the tapered surface contacts the inner edge of the opening, the contact area may be deformed, or particles such as grinding powders may be generated. With the flow rate control mechanism shown in FIGS. 5A to 6, even if the needle is inserted deeply, the needle will not contact the outer pipe so that deformation and generation of particles to be caused by the contact can be avoided.

Next, the structure of the buffer chamber will be described with reference to FIGS. 7A and 7B.

Figure 7A:
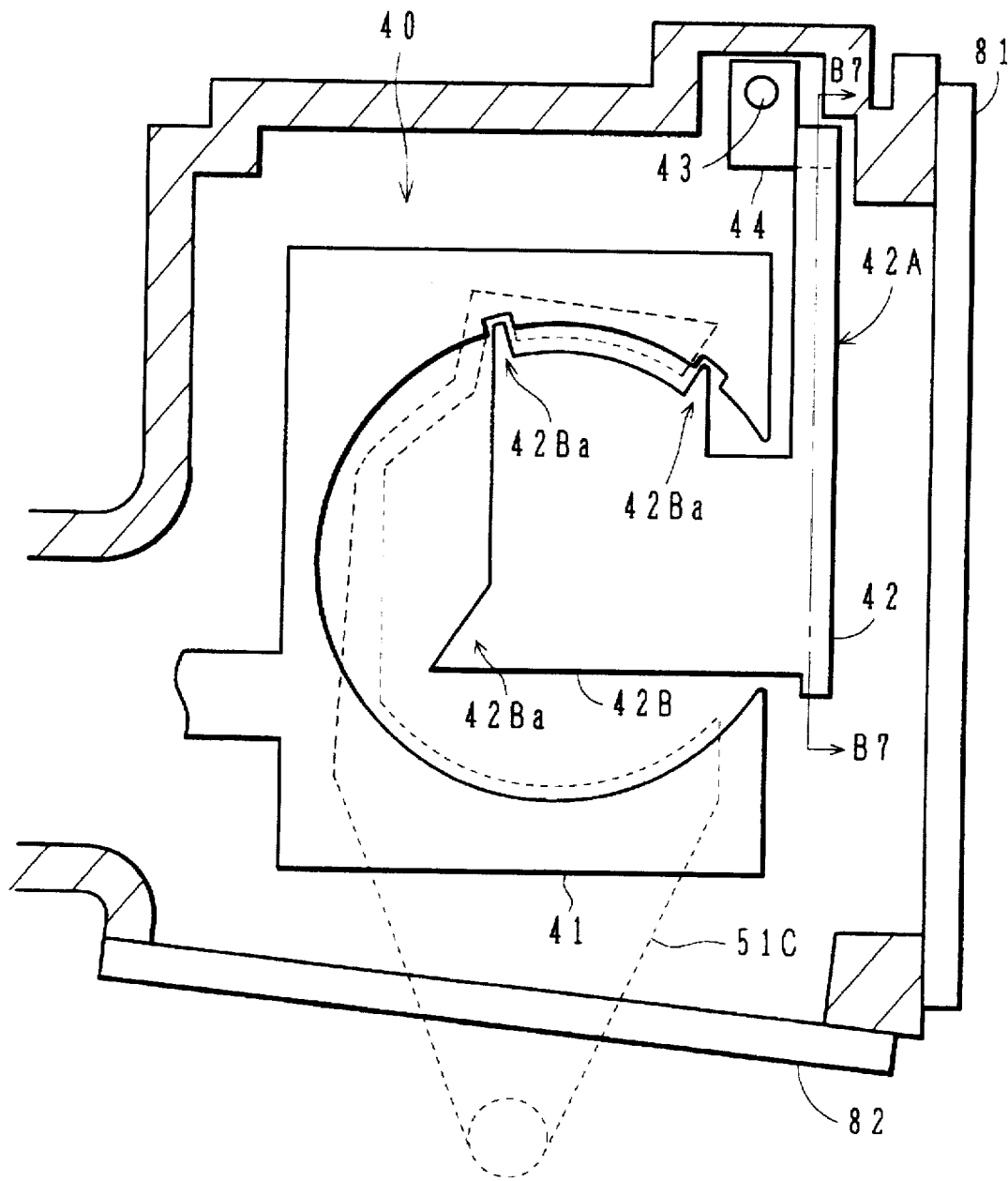
FIG. 7A is a plan view of a buffer chamber of the cleaning system shown in FIG. 3

FIG. 7A is a schematic plan view of the inside of the buffer chamber 40 shown in FIG. 3. The wafer holder 41 and buffer plate 42 are disposed in the buffer chamber 40. The buffer plate 42 is supported by a main pole 43. When a wafer is loaded or unloaded, the gate valve 82 is opened and the arm head 51C of the robotic arm is inserted into the buffer chamber 40.

The buffer plate 42 has a support member 44 fixed to the main pole 43 and two flat plates fixed to the support member 44.

Figure 7B:
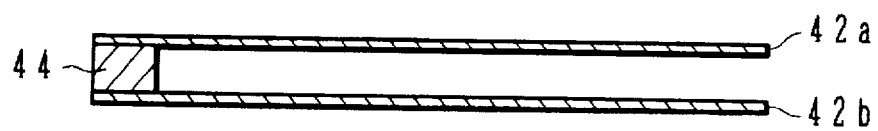
FIG. 7B is a cross sectional view of the buffer chamber taken along one-dot chain line B7—B7 of FIG. 7A.

FIG. 7B is a cross sectional view taken along one-dot chain line B7—B7 shown in FIG. 7A. Upper and lower flat plates 42a and 42b disposed in parallel with a constant distance are fixed to the support member 44. Both the upper and lower flat plates 42a and 42b have the same shape in plan view.

As shown in FIG. 7A, the upper and lower flat plates each have an arm portion 42A fixed to the support member 44 at one end thereof and locating downward as viewed in FIG. 7A along the gate valve 81, and a wafer holding portion 42B locating near from the other end of the arm portion 42A toward the central area of the buffer chamber 40. The wafer holding portion 42B holds a wafer on the upper surface thereof. In order to stably hold a wafer at the position near its outer peripheral area, the wafer holding portion 42B is provided with three projections 42Ba projecting from the central area to the outer periphery. A protrusions are formed on the upper surface of the projections 42Ba and a wafer is placed on these protrusions.

The main pole 43 can move linearly up and down (in the direction normal to the surface of the drawing sheet). The buffer plate 42 moves up and down together with the main pole 43.

The wafer holder 41 has a planar shape which surrounds the wafer holding portion 42B in three directions excepting the connection part to the arm portion 42A at the home position. The inner circumference of the wafer holder 41 has an arc having a diameter slightly smaller than the wafer diameter, and the outer circumference is rectangular. Recesses are formed in the inner circumference area of the wafer holder 41 at the positions corresponding to the projections 42Ba so that the wafer holder 41 and the buffer plate 42 are not overlapped in the horizontal plane. A wafer is held by placing the outer circumference area of the bottom surface of the wafer on the inner circumference area of the upper surface of the wafer holder 41. The structure of the wafer holder 41 will be later detailed with reference to FIG. 9.

The arm head 51C has a planar shape surrounding in the horizontal plane the wafer holding portion 42B in three directions excepting the connection part to the arm portion 42A, when it is inserted into the buffer chamber 40. The arm head 51C also has a planar shape so that the arm head 51C and buffer plate 42 are not overlapped in the horizontal plane. The arm head 51C holds a wafer on its upper surface, and transfers it to the wafer holding position of the wafer holder 41 at its home position. The structure of the arm head 51C will be later detailed with reference to FIG. 10.

The buffer plate 42 can move freely up and down because the wafer holder 41 and arm head 51C are not overlapped in the horizontal plane. As the buffer plate 42 rises, a wafer held by the wafer holder 41 or the arm head 51C is transferred to the buffer plate 42. Conversely, as the buffer plate 42 lowers, a wafer held by the buffer plate 42 is transferred to the wafer holder 41 or the arm head 51C.

Next, a method of transferring a wafer in the buffer chamber 40 will be described with reference to FIGS. 8A to 8I.

FIGS. 8A to 8I are schematic diagrams showing the position relationship in the height direction among the upper and lower flat plates 42a and 42b of the buffer plate, the wafer holder 41, and the arm head 51C.

As shown in FIG. 8A, the arm head 51C holding a wafer 62A before cleaning is inserted between the upper and lower flat plates 42a and 42b. As shown in FIG. 8B, the buffer plate 42 is raised to transfer the wafer 62A on the arm head 51C onto the lower flat plate 42b.

As shown in FIG. 8C, the arm head 51C is retracted from the buffer chamber 40, and the buffer plate 42 is lowered so that the wafer holder 41 is positioned between the upper and lower flat plates 42a and 42b. The wafer 62A is therefore transferred to the wafer holder 41. The wafer holder 41 is moved to the cleaning chamber to clean the wafer 62A. As shown in FIG. 8D, the buffer plate 42 is lowered while the wafer holder 41 is inserted into the cleaning chamber 30. When the wafer holder 41 returns back to the home position, the upper flat plate 42a is positioned lower than the wafer holder 41. As shown in FIG. 8E, the buffer plate 42 is raised so that the lower flat plate 42b is positioned higher than the wafer holder 41. The cleaned wafer 62A is therefore held on the upper flat plate 42a.

As shown in FIG. 8F, the arm head 51C holding a wafer 62B before cleaning is inserted between the upper and lower flat plates 42a and 42b. As shown in FIG. 8G, the buffer plate 42 is raised so that the lower flat plate 42b is positioned higher than the arm head 51C. The wafer 62B is therefore held on the lower flat plate 42b.

As shown in FIG. 8H, the arm head 51C is temporarily retracted from the buffer chamber, and it is again inserted between the upper and lower flat plates 42a and 42b. As shown in FIG. 8I, the upper flat plate is positioned between the arm head 51C and wafer holder 41, and the buffer plate 42 is lowered so that the lower flat plate 42b is positioned lower than the wafer holder 41. The wafer 62A is therefore transferred to the arm head 51C, and the wafer 62B is transferred to the wafer holder 41. The arm head 51C is thereafter retracted from the buffer chamber. By repeating the processes illustrated in FIGS. 8C to 8I, a plurality of wafers can be sequentially cleaned.

As above, the buffer plate is provided with two flat plates 42a and 42b for holding a wafer. Therefore, transfer of a wafer before cleaning from the arm head 51C to the wafer holder 41 and transfer of a cleaned wafer from the wafer holder 41 to the arm head 51C can be completed in short time.

In the description with FIGS. 8A to 8I, only the buffer plate 42 is moved up and down. Instead, the arm head 51C or wafer holder 41 may be moved up and down. Since the robotic arm has a function of moving up and down, the arm head 51C can be moved up and down without additional mechanism. For example, at the process shown in FIG. 8F, instead of raising the buffer plate 42, the arm head 51C may be lowered.

Next, the structure and operation of the wafer holder 41 will be described with reference to FIG. 9.

Figure 9:
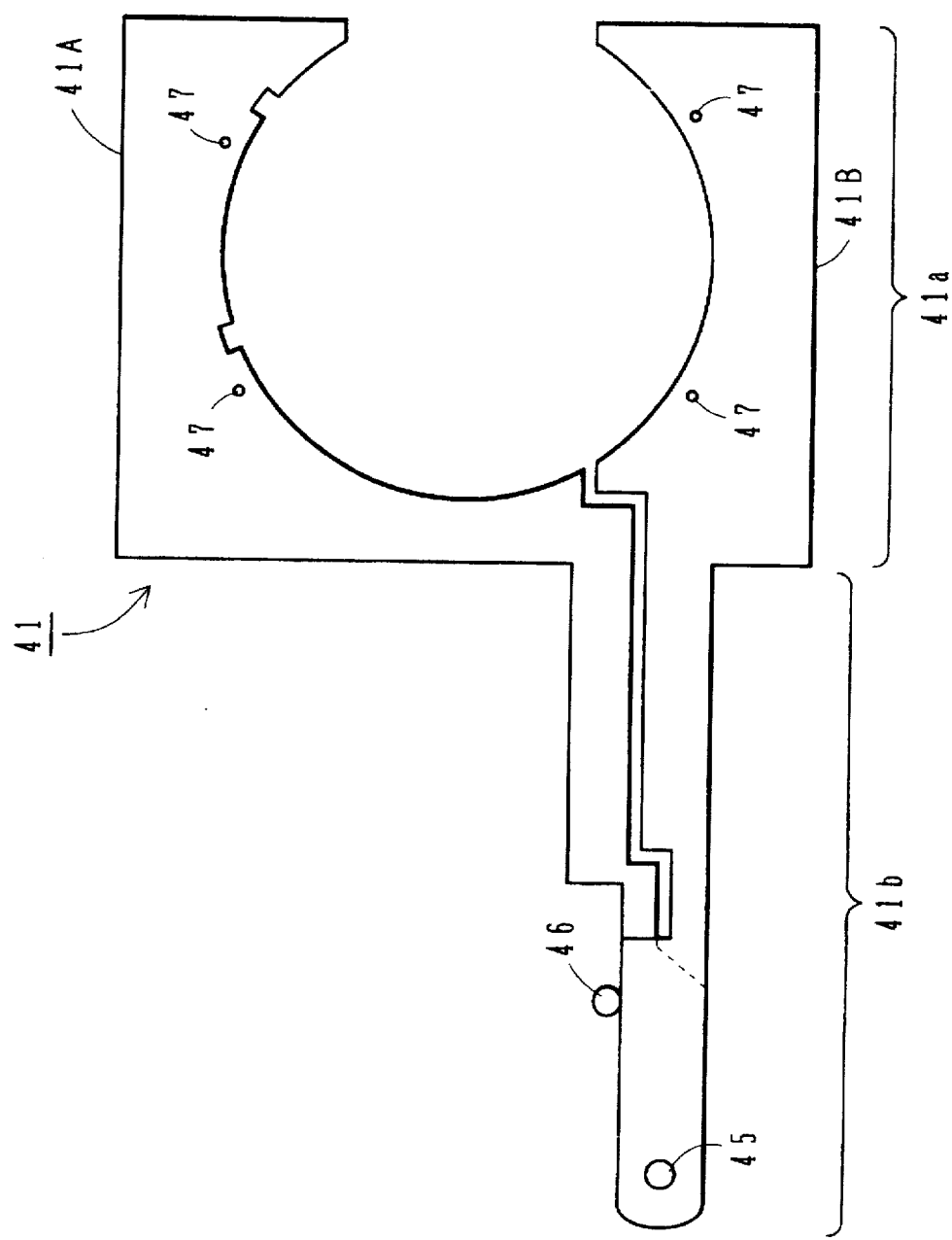
FIG. 9 is a plan view of a wafer holder of the cleaning system shown in FIG. 3.

FIG. 9 is a plan view of the wafer holder 41. The wafer holder 41 is constituted by a wafer holding portion 41a and an arm portion 41b. The wafer holding portion 41a has a planar shape formed with a circular cut portion at generally the central area of a rectangle, the circular cut portion opening at the right side of the rectangle as viewed in FIG. 9. The arm portion 41b extends to the left as viewed in FIG. 9 from the wafer holding portion 41a. The upper and lower portions as viewed in FIG. 9 are made of different flat plates 41A and 41B which are coupled by a support shaft 45 at the left end position and can be opened and closed. The flat plates 41A and 41B are overlapped in the up-down direction (direction normal to the surface of the drawing sheet) near at the support shaft 45, and the right portion of the arm portion 41b and the wafer holding portion 41a are disposed in the same horizontal plane.

The diameter of the circular cut portion formed in the wafer holding portion 41a is slightly smaller than the wafer diameter so that the wafer is held by placing the peripheral area of the bottom surface of the wafer on the upper circumferential area of the wafer holding portion near the circular cut portion.

An elastic member is provided between the flat plates 41A and 41B and biases the flat plates in the direction of closing them. A roller 46 is fixedly disposed at the position where the roller 46 becomes in contact with the arm portion of only the flat plate 41B at the overlapped area of the arm portions 41b, when the wafer holder 41 is at the home position in the buffer chamber 40 shown in FIG. 3. As the support shaft 45 is moved slightly up as viewed in FIG. 9, only the flat plate 41B abuts against the roller 46 and both the flat plates open slightly. As the support shaft 45 is moved to the initial position, the flat plates are closed by the recovery force of the elastic member.

A plurality of protrusions 47 are formed on the upper surface of the wafer holding portion 41a along the outer circumference line of a wafer to be held. After a wafer is placed on the wafer holding portion 41a under the conditions that the flat plates 41A and 41B are opened slightly, the flat plates 41A and 41B are closed so that the plurality of protrusions 47 push inward the outer circumference of the wafer. Accordingly, as compared to the case where a wafer is simply placed on the upper surface of the wafer holding portion 41a, a wafer can be held more stably and reliably.

Next, the structure and operation of the robotic arm will be described with reference to FIGS. 10 to 11B.

Figure 10:
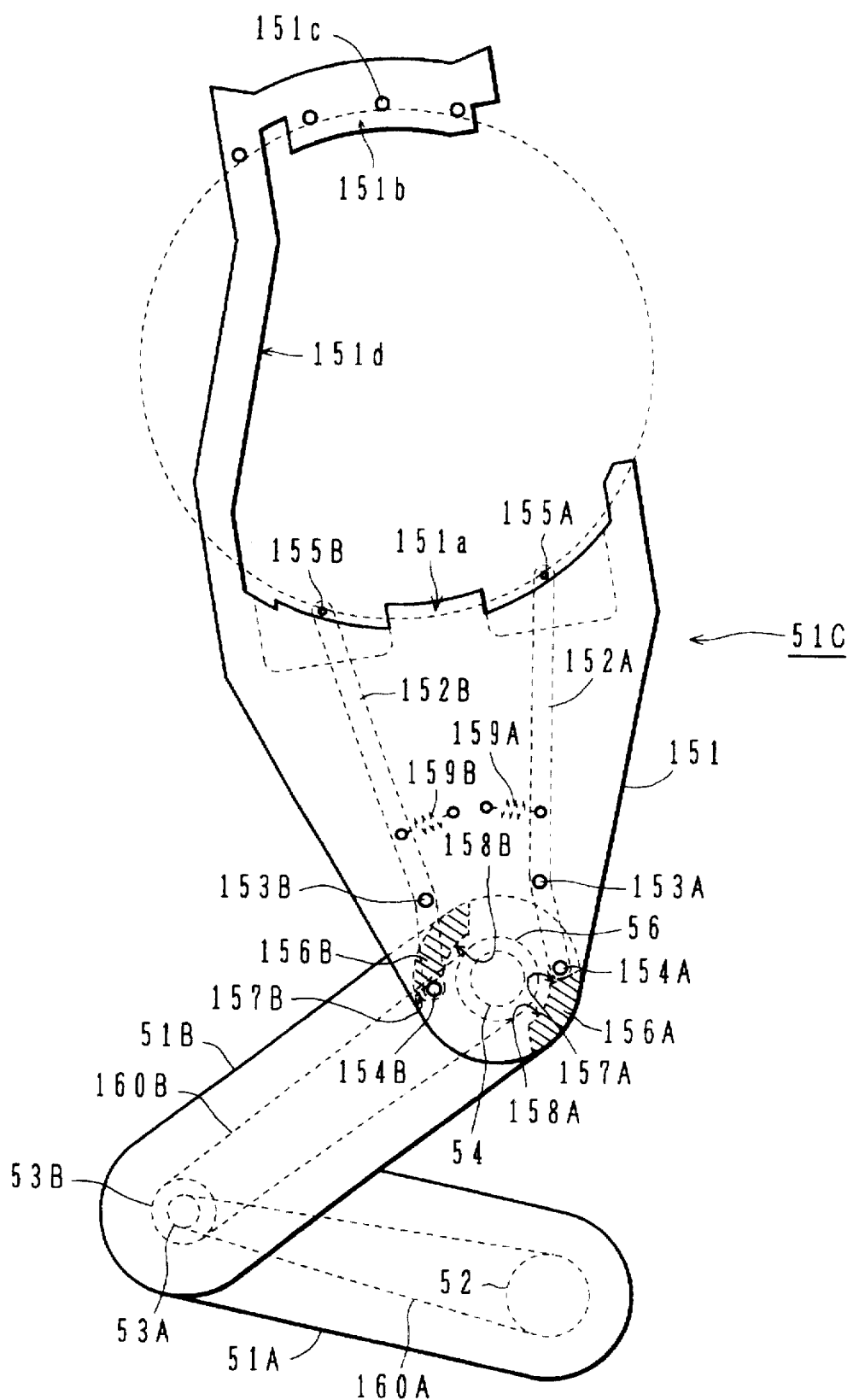
FIG. 10 is a plan view of an arm head of a robotic arm of the cleaning system shown in FIG. 3.

FIG. 10 is a plan view of the robotic arm. The robotic arm is constituted mainly by a first arm 51A, a second arm 51B, and an arm head 51C. The first arm 51A is coupled to a rotary shaft 52 projecting from the bottom surface of the robot chamber 50 shown in FIG. 3 in the vertical direction. The second arm 51B is coupled to the distal end of the first arm 51A, and the arm head 51C is coupled to the distal end of the second arm 51B. The lengths of the first and second arms 51A and 51B are the same.

The first arm 51A is mounted on the rotary shaft 52 rotatively relative to the bottom surface of the robot chamber 50. The second arm 51B is rotatively mounted on a rotary shaft 53B fixed to the first arm 51A. A rotary shaft 53A is fixed to the second arm 51B concentrically with the rotary shaft 53B. The rotary shafts 52 and 53A have cogs formed on the outer circumference side walls and are coupled by a timing belt 160A. The ratio of cogs of the rotary shaft 52 to those of the rotary shaft 53A is 2:1.

The arm head 51C is rotatively mounted on the rotary shaft 54 fixed to the second arm 51B. A rotary shaft 56 is fixed to the arm head 51C concentrically with the rotary shaft 54. The rotary shafts 53B and 56 have cogs formed on the outer circumference side walls and are coupled by a timing belt 160B. The ratio of cogs of the rotary shaft 53B to those of the rotary shaft 56 is 1:2.

The first and second arms 51A and 51B constitute foldable arms, and the axial direction of the arm head 51C is always directed toward the rotary shaft 52. For this foldable function, each rotation axis is constituted by a double mechanism described above.

Convexes 156A and 156B (indicated by hatched lines in FIG. 10) protruding from the upper surface of the second arm 51B are formed around the rotary shaft 54. The convexes 156A and 156B are symmetrical with the central axis of the rotary shaft 54. The convexes 156A and 156B define, on their side walls, cam surfaces 157A and 158A and cam surfaces 157B and 158B respectively. The cam surfaces 158A and 158B are parts of cylindrical surfaces having the central axis of the rotary shaft 54 as their center. The distances from the cam surfaces 157A and 157B to the central axis of the rotary shaft 54 are not constant and are gradually and monotonically changed. Therefore, as the cam surfaces rotate, the cam follower surfaces in contact with the cam surface 157A or 157B are driven in the radial direction of the rotary shaft 54.

The arm head 51C is constituted mainly by a support member 151 mounted on the second arm 51B and auxiliary support members 152A and 152B mounted on the support member 151.

The support member 151 is formed with wafer holding surfaces 151a and 151b for holding a wafer 62 horizontally (perpendicular to the rotary shaft 54). The wafer holding surface 151a holds the outer peripheral area of the wafer 62 on the rotary shaft 54 side, and the wafer holding surface 151b holds the outer peripheral area of the wafer 62 opposite to the rotary shaft 54 side. The wafer holding surface 151b is fixed to the rotary shaft 56 via a coupling portion 151d.

A plurality of stopper protrusions 151c are formed on the wafer holding surface 151b along the outer circumference line of the wafer 62. The outer circumference side wall of the wafer 62 placed on the wafer holding surface 151b becomes in contact with the side walls of the protrusions 151c so that the wafer 62 is supported (stopped) in one direction in the holding surface plane.

The auxiliary support members 152A and 152B are respectively mounted on support shafts 153A and 153B formed on the lower surface (back side of the drawing sheet) of the supporting member 151, and can swing in the holding surface plane. The auxiliary support members 152A and 152B are symmetrical with a virtual plane containing the central axis of the rotary shaft 54 and passing through the center of the wafer holding surface 151b.

Rollers 154A and 154B are respectively mounted on the auxiliary support members 152A and 152B at their one ends. The outer surfaces of the rollers 154A and 154B are made in contact with the cam surfaces 157A and 158A and cam surfaces 157B and 158B respectively. As the arm head 51C rotates around the rotary shaft 54, the rollers 154A and 154B move along the cam surfaces.

Protrusions 155A and 155B are respectively formed at the other ends of the auxiliary support members 152A and 152B, the protrusions contacting the outer circumference side wall of the wafer 62 and pushing the wafer toward the protrusions 151c side. The auxiliary support members 152A and 152B are respectively biased by elastic members 159A and 159B so that the ends of the members on the side of the protrusions 155A and 155B swing to move near to each other. As the ends of the members on the side of the protrusions 155A and 155B swing to move away from each other, the protrusions 155A and 155B move under the support member 151. Recesses are formed on the lower surface (back side of the drawing sheet) of the support member 151 at the track areas of the protrusions 155A and 155B so that the protrusions 155A and 155B will not contact the support member 151.

Figure 11A:
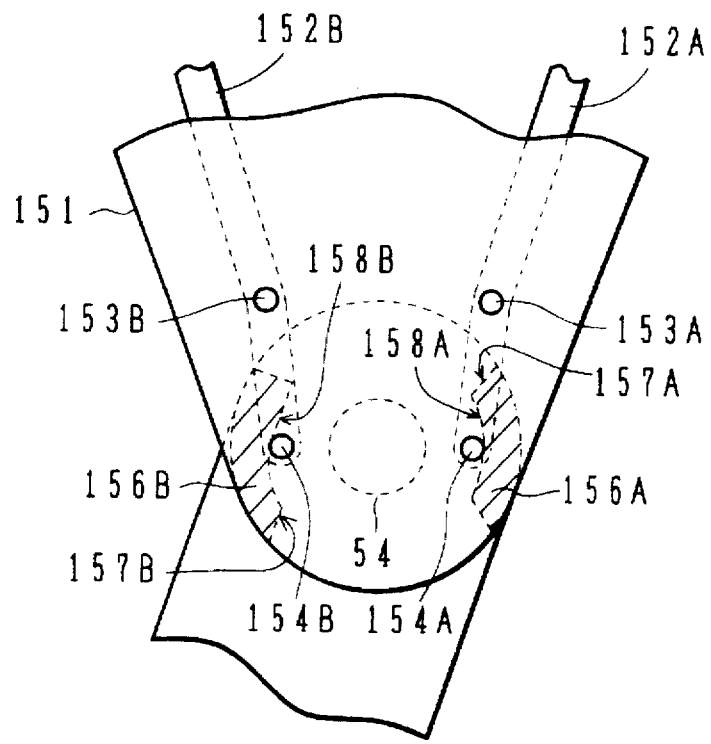
FIG. 11A is a partial plan view of the robotic arm shown in FIG. 10
Figure 11B:
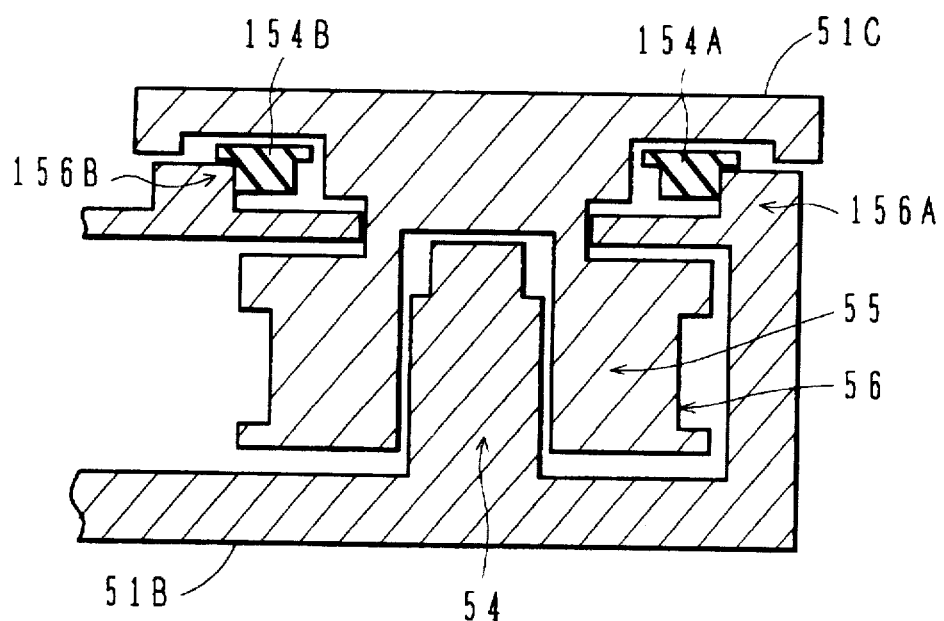
FIG. 11B is a partial cross sectional view thereof.

FIG. 11B is a cross sectional view of a cam mechanism. The second arm 51B is of a planar shape having an inner void, and is formed with the rotary shaft 54 projecting from the inner bottom surface toward the central void. An engaging portion 55 is formed on the lower surface of the arm head 51C. The recess of the engaging portion 55 engages with the rotary shaft 54 so that the arm head 51C can be mounted rotatively on the second arm 51B.

The convexes 156A and 156B are formed on the upper surface of the second arm 51B. The cam surfaces of the convexes 156A and 156B are respectively in contact with the outer circumference side walls of the rollers 154A and 154B.

The operation of the robotic arm will be described next.

For contracting the robotic arm, the first arm 51A is rotated in the counter-clockwise direction, for example, by an angle θ around the rotary shaft 52 while fixing the rotary shaft 52. This rotation is equivalent to a rotation of the rotary shaft 52 in the clockwise direction by the angle θ relative to the first arm 51A. The rotary shaft 53A coupled to the rotary shaft 52 by the timing belt 160A rotates by an angle 2 θ relative to the first arm 51A. Since the rotary shaft 53A is fixed to the second arm 51B, the second arm 51B rotates in the clockwise direction by the angle 2 θ relative to the first arm 51A. Consider now an isosceles triangle having the central axes of the rotary shafts 52, 53A and 54 as its apexes. As the robot arm is contracted, the apex angle of this isosceles triangle becomes smaller by the angle 2 θ. Therefore, the base angle becomes larger by the angle θ. Since the base angle of the isosceles becomes larger by the angle θ when the first arm 51A is rotated in the counter-clockwise direction by the angle θ, the direction of a straight line interconnecting the central axes of the rotary shafts 52 and 54 does not change, i.e., the direction of the robot arm does not change but only the length thereof is shortened.

Since the second arm 51B rotates in the clockwise direction by the angle 2 θ relative to the first arm 51A, the rotary shaft 53B fixed to the first arm 51A rotates in the counter-clockwise direction by the angle 2 θ relative to the second arm 51B. The rotary shaft 56 coupled to the rotary shaft 53b by the timing belt 160B rotates in the counter-clockwise direction by the angle θ relative to the second arm 51B. The arm head 51C fixed to the rotary shaft 56 also rotates in the counter-clockwise direction by the angle θ relative to the second arm 51B. Since the second arm 51B rotates in the clockwise direction by the angle 2 θ relative to the first arm 51A, the arm head 51C rotates in the clockwise direction by the angle θ relative to the first arm 51A.

As the first arm 51A is rotated in the counterclockwise direction by the angle θ, the arm head 51C rotates in the clockwise direction by the angle θ relative to the first arm 51A. Therefore, the direction of the arm head 51C does not change, i.e., the arm head 51C performs a translation motion moving near to the rotary shaft 52.

As the arm head 51C rotates in the counter-clockwise direction around the rotary shaft 54 relative to the second arm 51B, the roller 154A moves from the cam surface 158A to the cam surface 157A as shown in FIG. 10. The auxiliary support member 152A swings in the counter-clockwise direction by the recovery force of the elastic member 159A, using the support shaft 153A as a fulcrum. Similarly, the auxiliary support member 152B swings in the clockwise direction, using the support shaft 153B as a fulcrum. The protrusions 155A and 155B push the wafer 62 to the protrusions 151c side and hold the wafer 62 on the wafer holding surfaces 151a and 151b at the predetermined position.

FIG. 11A is a plan view of the cam mechanism when the robot arm is expanded. Referring to FIG. 10, as the first arm 51A is rotated in the clockwise direction, while fixing the rotary shaft 52, the arm head 51C performs a translation motion moving away from the rotary shaft 52. The arm head 51C rotates in the clockwise direction around the rotary shaft 54 relative to the second arm 51B. The roller 154A moves from the cam surface 157A to the cam surface 158A. The auxiliary support member 152A swings in the clockwise direction, using the support shaft 153A as a fulcrum. Similarly, the auxiliary support member 152B swings in the counter-clockwise direction, using the support shaft 153B as a fulcrum.

Referring to FIG. 10, the protrusions 155A and 155B move under the support member 151 and release the support of the wafer 62. As above, when the robot arm is contracted, it automatically holds a wafer, and when it is expanded, it automatically releases the support of a wafer.

Since the cam mechanism uses the cam surfaces formed on the second arm 51B and the cam follower surfaces formed on the arm head 51C, an additional drive mechanism for swinging the auxiliary support members 152A and 152B is not necessary for holding a wafer.

In the description with FIG. 10, a pair of auxiliary support members are used. A pair of members are not necessarily required. A single auxiliary support member can hold a wafer in the holding surface plane. Also in the description with FIG. 10, although a wafer is held illustratively, an object to be held is not limited to a wafer. Other objects other than a wafer may be held if the shapes of the protrusions 151c, 155A and 155B are properly selected. If an object can be held only by the protrusions 151c, 155A and 155B, the wafer holding surfaces 151a and 151b are not necessarily required.

Also in the description with FIG. 10, although the cam surfaces are disposed facing the rotary shaft, they may be disposed facing the side opposite to the rotary shaft. The roller 154A or 154B may be sandwiched between the confronting two cam surfaces. Another cam mechanism may be used, or a cooperative motion mechanism other than the cam mechanism may also be used.

Next, the structure and operation of the shielding plate 107 shown in FIG. 4 will be described with reference to FIGS. 12A and 12B.

Figure 12A:
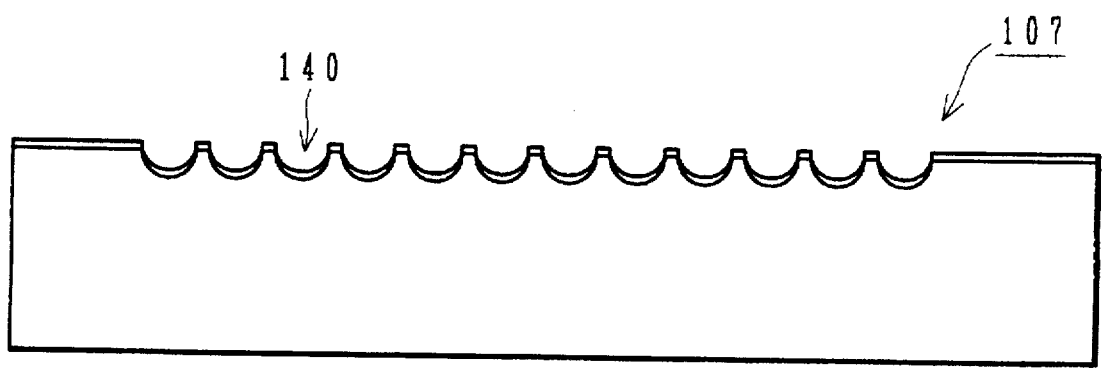
FIG. 12A is a plan view of a shielding plate of the cleaning system shown in FIG. 3

FIG. 12A is a plan view of the shielding plate 107. The shielding plate 107 is formed with a plurality of semicircular cuts 140 at one side of a rectangular stainless steel plate. The pitch of the cuts 140 is equal to the nozzle holes 32 of the nozzle header 31 shown in FIG. 3. The end facet at the side where the cuts 140 are formed is made a slanted surface at an gradient angle of 60 degrees.

Figure 12B:
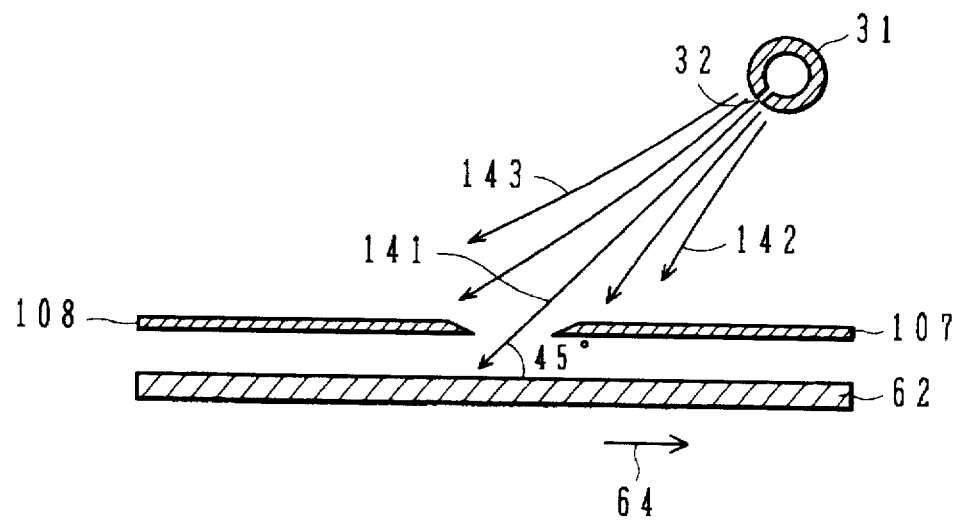
FIG. 12B is a cross sectional view of a nozzle header, shielding plate, and wafer.

FIG. 12B is a cross sectional view of the nozzle header 31, shielding plates 107 and 108, and wafer 62 under cleaning, wherein the central axis 141 of a gas flow jetted out of the nozzle holes 32 intersects the wafer surface at 45 degrees. The shielding plate 107 is positioned so that the center of each semicircular cut 140 is aligned with the central axis 141 of the gas flow jetted out of the nozzle holes 32.

The shielding plate 107 is disposed at the position 5 mm higher than the surface of the wafer 62. The nozzle header 31 is disposed at the position where the distance from the surface of the wafer 62 to the nozzle holes 32 becomes 20 mm long along the central axis 141 of the gas flow. Under these conditions, wafers were cleaned. As compared to the cleaning without the shielding plate 107, the shielding plate 107 with cuts 140 having a radius of 3 mm or 4 mm provided higher cleaning effects. As compared to the cleaning without the shielding plate 107, the shielding effects by using the shielding plate 107 with cuts 140 having a radius of 5 mm hardly changed.

The reason why the shielding plate 107 with cuts 140 having a radius of 3 mm or 4 mm provided higher cleaning effects may be ascribed in the following manner. A gas flow jetted out of the nozzle holes 32 gradually becomes broad as it propagates. It can be considered that a flow flux near the outer peripheral area of the gas flow contains gas passing near the inner surface of each nozzle hole 32, and therefore contains contamination emitted from the inner surface of each nozzle hole 32. A speed of a flow flux near the outer peripheral area of the gas flow is slower than that near the central area and so the cleaning effects are poor.

It can be therefore considered that the flow flux near the outer peripheral area of the gas flow has a stronger action of depositing contamination rather than the action of cleaning the wafer surface. Flow fluxes downstream of the central axis 141 in the moving direction of the wafer to be cleaned collide with the surface area which has already been cleaned by the central flow fluxes. In the example shown in FIG. 12B, the flow flux 142 downstream of the central axis 141 of the gas flow in the moving direction of the wafer 62 to be cleaned (direction indicated by an arrow 64 in FIG. 12B) collide with the surface area which has already been cleaned. Therefore, the wafer surface contaminated by this flow flux 142 is not cleaned thereafter. It can be considered therefore that high cleaning effects can be obtained by intercepting the flow flux 142 by the shielding plate 107.

The wafer surface contaminated by a flow flux 143 upstream of the central axis 141 of the gas flow at the left side as viewed in FIG. 12B, is cleaned thereafter by the central flow fluxes of the gas flow. It can be considered therefore that the influence of contamination by the flow flux 143 is small. In order to avoid contamination by the flow flux 143, another shielding plate 108 may be used at the position confronting the shielding plate 107 over the central axis 141 of the gas flow.

In the above experiments, the height of the shielding plate from the wafer surface was set to 5 mm. This height may be changed. Similar effects may be expected at the height range from 2 to 5 mm. The nozzle header 31 may be disposed at the position where the distance from the surface of the wafer 62 to the nozzle holes 32 becomes 5-20 mm long along the central axis 141 of the gas flow.

In the description with FIG. 12A, the shielding plate is formed with semicircular cuts at the linear outer periphery of the plate. Semicircular cuts are not necessarily required. For example, arc cuts having a center angle of smaller than 180 degrees may be formed, or a shielding plate without cuts and having a linear shape may be used.

In the above embodiment, the cleaning surface is directed upward by placing a wafer horizontally. The direction of the wafer surface is not necessarily limited thereto. For example, the cleaning surface may be directed downward or a wafer may be placed vertically.

The present invention has been described in connection with the preferred embodiments. The invention is not limited only to the above embodiments. It is apparent to those skilled in the art that various modifications, improvements, combinations and the like can be made without departing from the scope of the appended claims.

We claim:

1. A robotic arm comprising:

a rotary shaft;

an articulated arm member fixed to said rotary shaft and having a folding expansion/contraction mechanism;

a support member rotatively supported by a distal end of said arm member, said folding mechanism being connected between said shaft and said support member for providing a constant relationship between said rotary shaft and said support member;

an auxiliary support member supported by a support shaft fixed to said support member for supporting a workpiece in cooperation with said support member, said auxiliary support member being swingable an association with a folding expansion/contraction motion of said arm member and a cam mechanism provided at portions where said auxiliary support member and said arm member are coupled with each other for swinging said auxiliary support member in association with said folding expansion/contraction motion of said arm member.

2. A robotic arm according to claim 1, wherein:

said cam mechanism comprises:

a cam surface formed on and fixed to said arm member around a central rotation axis of said portions; and a cam follower surface formed on said auxiliary support member for contacting said cam surface, and said robotic arm further comprises an elastic member connected between said auxiliary support member and said support member for imparting a swinging force to said auxiliary member and making said cam follower surface push said cam surface.

3. A robotic arm according to claim 1, wherein:

said support member includes a support surface for supporting a workpiece in one direction; and said auxiliary support member includes an auxiliary support surface facing said support surface of said support member for sandwiching the workpiece with said support surface of said support member.

4. A robotic arm according to claim 2, wherein said support member includes a support surface for supporting a workpiece in one direction; and said auxiliary support member includes an auxiliary support surface facing said support surface of said support member for sandwiching the workpiece with said support surface of said support member.

5. A robotic arm according to claim 3, wherein:

said support member has a holding surface for holding the workpiece; and said support surface and said auxiliary support surface contact the side wall of the workpiece held by the holding surface to constrain the position of the workpiece.

6. A robotic arm according to claim 4, wherein:

said support member has a holding surface for holding the workpiece and said support surface and said auxiliary support surface contact the side wall of the workpiece held by the holding surface to constrain the position of the workpiece.

7. A robotic arm according to claim 1, further comprising another auxiliary member mounted on said support member, said another auxiliary member being capable of swinging and being symmetrical to said auxiliary member relative to a virtual plane containing a central rotation axis of the portions and passing through the center of said support surface; and wherein said cam mechanism further includes another cam surface for driving said another auxiliary support member, said another cam surface being symmetrical with said cam surface relative to the central rotation axis of said portions.

8. A robotic arm according to claim 2, further comprising another auxiliary member mounted on said support member, said another auxiliary member being capable of swinging and being symmetrical to said auxiliary member relative to a virtual plane containing a central rotation axis of the portions and passing through the center of said support surface; and wherein said cam mechanism further includes another cam surface for driving said other auxiliary support member, said another cam surface being symmetrical with said cam surface relative to the central rotation axis of said portions.

* * * * *